US012650563B2

(12) United States Patent
Aggarwal et al.

(10) Patent No.: US 12,650,563 B2
(45) Date of Patent: Jun. 9, 2026

(54) PACKAGING OPTICAL COMPONENTS IN A CIRCUIT PACKAGE

(71) Applicant: Celestial AI Inc., Santa Clara, CA (US)

(72) Inventors: Ankur Aggarwal, Pleasanton, CA (US); Anmol Rathi, San Jose, CA (US); Suresh Venkata Pothukuchi, Chandler, AZ (US)

(73) Assignee: Celestial AI Inc., Santa Clara, CA (US)

( * ) Notice: Subject to any disclaimer, the term of this patent is extended or adjusted under 35 U.S.C. 154(b) by 0 days.

(21) Appl. No.: 19/097,749

(22) Filed: Apr. 1, 2025

(65) Prior Publication Data

US 2025/0370205 A1      Dec. 4, 2025

Related U.S. Application Data

(60) Provisional application No. 63/694,684, filed on Sep. 13, 2024, provisional application No. 63/655,461, filed on Jun. 3, 2024.

(51) Int. Cl.
G02B 6/42          (2006.01)
G02B 6/12          (2006.01)
(Continued)

(52) U.S. Cl.
CPC ....... G02B 6/4239 (2013.01); G02B 6/12004 (2013.01); G02B 6/13 (2013.01);
(Continued)

(58) Field of Classification Search
CPC ................................ G02B 6/42; G02B 6/4278
See application file for complete search history.

(56) References Cited

U.S. PATENT DOCUMENTS 7,778,501 B2      8/2010   Beausoleil et al.
7,889,996 B2      2/2011   Zheng et al.
(Continued)

FOREIGN PATENT DOCUMENTS

CN          106980160 A      7/2017
WO      WO2023177417         9/2022
(Continued)

OTHER PUBLICATIONS

U.S. Appl. No. 17/807,692, filed Jun. 17, 2022, Winterbottom et al.
(Continued)

*Primary Examiner* — Michael P Mooney
(74) *Attorney, Agent, or Firm* — Ray Quinney & Nebeker P.C.; James S. Bullough

(57)      ABSTRACT

The present disclosure relates to example implementations of optically accessible circuit packages. For example, this disclosure includes implementations for creating a circuit package with a photonic integrated circuit (PIC) connected to electrical integrated circuit (EIC) components via an organic interposer. In many implementations, the circuit package maintains optical access to a gating coupler (GC) region on the PIC via an internal cavity area in the organic interposer. In this way, a fiber array unit (FAU) or other optical connection can couple to the circuit package to communicate data from the EIC components of the circuit package and another circuit package or an external device connected to the FAU (e.g., both send and receive data with the cp) via the open access GC region.

30 Claims, 28 Drawing Sheets

(51) Int. Cl.

| | |
|---|---|
| *G02B 6/13* | (2006.01) |
| *G02B 6/43* | (2006.01) |
| *H10B 80/00* | (2026.01) |
| *H10D 80/30* | (2026.01) |
| *H10F 55/00* | (2025.01) |
| *H10W 20/20* | (2026.01) |
| *H10W 70/60* | (2026.01) |
| *H10W 70/63* | (2026.01) |
| *H10W 70/65* | (2026.01) |
| *H10W 74/10* | (2026.01) |
| *H10W 90/00* | (2026.01) |
| *H10W 72/90* | (2026.01) |

(52) U.S. Cl.

CPC ............. *G02B 6/42* (2013.01); *G02B 6/4215* (2013.01); *G02B 6/4228* (2013.01); *G02B 6/4243* (2013.01); *G02B 6/4246* (2013.01); *G02B 6/4249* (2013.01); *G02B 6/4251* (2013.01); *G02B 6/4255* (2013.01); *G02B 6/4256* (2013.01); *G02B 6/4259* (2013.01); *G02B 6/4274* (2013.01); *G02B 6/4278* (2013.01); *G02B 6/428* (2013.01); *G02B 6/4292* (2013.01); *G02B 6/4293* (2013.01); *G02B 6/4295* (2013.01); *G02B 6/43* (2013.01); *H10B 80/00* (2023.02); *H10D 80/30* (2025.01); *H10F 55/00* (2025.01); *H10W 20/20* (2026.01); *H10W 70/611* (2026.01); *H10W 70/635* (2026.01); *H10W 70/65* (2026.01); *H10W 74/111* (2026.01); *H10W 74/117* (2026.01); *H10W 74/124* (2026.01); *H10W 90/00* (2026.01); *H10W 90/701* (2026.01); *H10W 72/90* (2026.01); *H10W 90/734* (2026.01)

(56) References Cited

U.S. PATENT DOCUMENTS

| | | | |
|---|---|---|---|
| 7,961,990 | B2 | 6/2011 | Krishnamoorthy et al. |
| 8,064,739 | B2 | 11/2011 | Binkert et al. |
| 8,237,278 | B2 * | 8/2012 | Gluschenkov .... H01L 23/49827 257/738 |
| 9,495,295 | B1 | 11/2016 | Dutt et al. |
| 9,791,761 | B1 | 10/2017 | Li et al. |
| 9,831,360 | B2 | 11/2017 | Knights et al. |
| 10,168,475 | B2 | 1/2019 | Parker et al. |
| 10,852,492 | B1 | 12/2020 | Vermeulen et al. |
| 10,962,728 | B2 | 3/2021 | Nelson et al. |
| 10,976,491 | B2 | 4/2021 | Coolbaugh et al. |
| 11,107,770 | B1 | 8/2021 | Ramalingam et al. |
| 11,222,867 | B1 | 1/2022 | Huang et al. |
| 11,233,580 | B2 | 1/2022 | Meade et al. |
| 11,336,376 | B1 | 5/2022 | Xie |
| 11,493,714 | B1 | 11/2022 | Mendoza et al. |
| 11,500,153 | B2 | 11/2022 | Meade et al. |
| 11,509,397 | B2 | 11/2022 | Ma et al. |
| 11,817,903 | B2 | 11/2023 | Pleros et al. |
| 11,837,509 | B1 | 12/2023 | Chou et al. |
| 12,055,766 | B2 | 8/2024 | Pupalaikis et al. |
| 12,148,742 | B2 | 11/2024 | Liljeberg et al. |
| 12,191,257 | B2 | 1/2025 | Aggarwal |
| 2011/0206379 | A1 | 8/2011 | Budd |
| 2015/0354938 | A1 | 12/2015 | Mower et al. |
| 2016/0116688 | A1 | 4/2016 | Hochberg et al. |
| 2017/0045697 | A1 | 2/2017 | Hochberg et al. |
| 2017/0115458 | A1 | 4/2017 | Mekis et al. |
| 2017/0194309 | A1 | 7/2017 | Evans et al. |
| 2017/0207600 | A1 | 7/2017 | Klamkin et al. |
| 2017/0237226 | A1 | 8/2017 | Johnson et al. |
| 2017/0261693 | A1 * | 9/2017 | Gambino ................. G02B 6/13 |
| 2017/0261708 | A1 | 9/2017 | Ding et al. |
| 2019/0049665 | A1 | 2/2019 | Ma et al. |
| 2019/0067037 | A1 | 2/2019 | Pelletier et al. |
| 2019/0205737 | A1 | 7/2019 | Bleiweiss et al. |
| 2019/0265408 | A1 | 8/2019 | Ji et al. |
| 2019/0317285 | A1 | 10/2019 | Liff |
| 2019/0317287 | A1 | 10/2019 | Raghunathan et al. |
| 2020/0006304 | A1 | 1/2020 | Chang et al. |
| 2020/0142441 | A1 | 5/2020 | Bunandar et al. |
| 2020/0158967 | A1 | 5/2020 | Winzer et al. |
| 2020/0200987 | A1 | 6/2020 | Kim |
| 2020/0203309 | A1 | 6/2020 | Beyne |
| 2020/0250532 | A1 | 8/2020 | Shen et al. |
| 2020/0284981 | A1 | 9/2020 | Harris et al. |
| 2021/0064958 | A1 | 3/2021 | Lin et al. |
| 2021/0132309 | A1 | 5/2021 | Zhang et al. |
| 2021/0247569 | A1 | 8/2021 | Traverso et al. |
| 2021/0257396 | A1 | 8/2021 | Piggott et al. |
| 2021/0266200 | A1 | 8/2021 | Yang |
| 2021/0271020 | A1 | 9/2021 | Islam et al. |
| 2021/0286129 | A1 | 9/2021 | Fini et al. |
| 2022/0091332 | A1 | 3/2022 | Yoo et al. |
| 2022/0159860 | A1 | 5/2022 | Winzer et al. |
| 2022/0171142 | A1 | 6/2022 | Wright et al. |
| 2022/0328395 | A1 | 10/2022 | Chen et al. |
| 2022/0342150 | A1 | 10/2022 | Karhade et al. |
| 2022/0342164 | A1 | 10/2022 | Chen et al. |
| 2022/0374575 | A1 | 11/2022 | Ramey et al. |
| 2022/0382005 | A1 | 12/2022 | Rusu |
| 2023/0088009 | A1 | 3/2023 | Karhade et al. |
| 2023/0197699 | A1 | 6/2023 | Spreitzer et al. |
| 2023/0258881 | A1 | 8/2023 | Weng et al. |
| 2023/0258886 | A1 | 8/2023 | Liao |
| 2023/0308188 | A1 | 9/2023 | Dorta-Quinones |
| 2023/0314702 | A1 | 10/2023 | Yu |
| 2023/0352464 | A1 | 11/2023 | Damaraju et al. |
| 2023/0376818 | A1 | 11/2023 | Nowak |
| 2023/0393357 | A1 | 12/2023 | Ranno |
| 2023/0395443 | A1 * | 12/2023 | Lai .......................... H01L 25/16 |
| 2024/0030065 | A1 | 1/2024 | Duan et al. |
| 2024/0030147 | A1 | 1/2024 | Duan et al. |
| 2024/0030204 | A1 | 1/2024 | Duan et al. |
| 2024/0036254 | A1 | 2/2024 | Winzer et al. |
| 2024/0097796 | A1 | 3/2024 | Winzer et al. |
| 2024/0272385 | A1 * | 8/2024 | Chen ................... G02B 6/4239 |
| 2025/0062258 | A1 | 2/2025 | Kannan et al. |
| 2025/0167187 | A1 | 5/2025 | Yu et al. |
| 2025/0201793 | A1 | 6/2025 | Suthram et al. |
| 2025/0216629 | A1 | 7/2025 | Psaila et al. |

FOREIGN PATENT DOCUMENTS

| | | |
|---|---|---|
| WO | WO2022266676 | 12/2022 |
| WO | WO2023177922 | 9/2023 |

OTHER PUBLICATIONS

U.S. Appl. No. 18/293,673, filed Oct. 17, 2024, Bos et al.

Agrawal, Govind; "Chapter 4—Optical Receivers", Fiber-Optic Communications Systems, John Wiley & Sons, Inc., (2002), pp. 133-182.

Eltes, Felix et al.; "A BaTiO3-Based Electro-Optic Pockets Modulator Monolithically Integrated on an Advanced Silicon Photonics Platform"; J. Lightwave Technol. vol. 37, No. 5; (2019), pp. 1456-1462.

Eltes, Felix et al.; Low-Loss BaTiO3-Si Waveguides for Nonlinear Integrated Photonics; ACS Photon., vol. 3, No. 9; (2016), pp. 1698-1703.

Harris, NC et al.; "Efficient, compact and low loss thermo-optic phase shifter in colicon"; Opt. Express, vol. 22, No. 9; (2014), pp. 10487-10493.

Hendry, G. et al.; "Circuit-Switched Memory Access in Photonic Interconnection Networks for High-Performance Embedded Computing," SC '10: Proceedings of the 2010 ACM/IEEE International Conference for High Performance Computing, Networking, Storage and Analysis, New Orleans, LA, USA, 2010, pp. 1-12.

Miller, David A. et al.; "Self-Configuring Universal Linear Optical Component"; Photon. Res. 1; [Online]; Retrieved from the interent:

(56) References Cited

OTHER PUBLICATIONS

URL: https://arxiv.org/ftp/arxiv/papers/1303/1303.4602.pdf; (2013), pp. 1-15.

Raj, Mayank et al.; "Design of a 50-GB/s Hybid Integrated Si-Photonic Optical Link in 16-nm FinFET"; IEEE Journal of Solid-State Circuits, vol. 55, No. 4, Apr. 2020, pp. 1086-1095.

Zhang, Yulong; "Building blocks of a silicon photonic integrated wavelength division multiplexing transmitter for detector instrumentation" , Doktors Der Ingenieurwissenschaften (Dr. -Ing. ), Dec. 15, 2020 (Dec. 15, 2020), 128 pages.

"International Search Report and Written Opinion issued in PCT Application No. PCT/US2025/031959", Mail Date: Sep. 16, 2026, 17 pages.

* cited by examiner

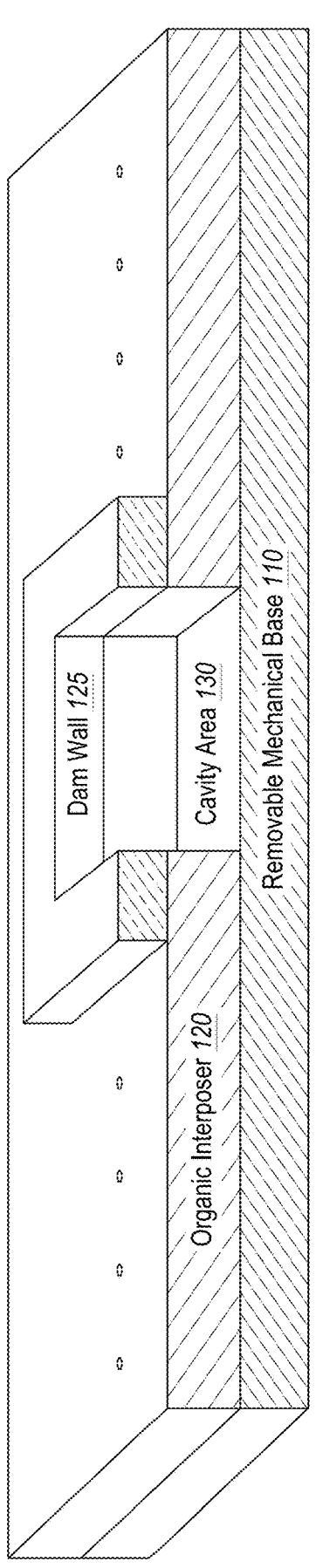
*FIG. 1A*

Circuit Package Portion 200

Cavity Area 130

120

110

Organic Interposer 120

Removable Mechanical Base 110

FIG. 2A

Circuit Package Portion
200

Cavity Area
130

Dam Wall 125

120

110

Organic Interposer 120

Removable Mechanical Base
110

*FIG. 2B*

Circuit Package
400

Grating Coupler Region
452

PIC 450

Internal Cavity Area
430

425

425

Debonding Layer 412

Removable Mechanical Base 410

420

420

Electrical Connections
454

Organic Interposer
420

Circuit Package 400

Underfill Clog 442

PIC 450

452

Internal Cavity Area 430

Debonding Layer 412

Removable Mechanical Base 410

425

425

420

440

Underfill Material 440

Organic Interposer 420

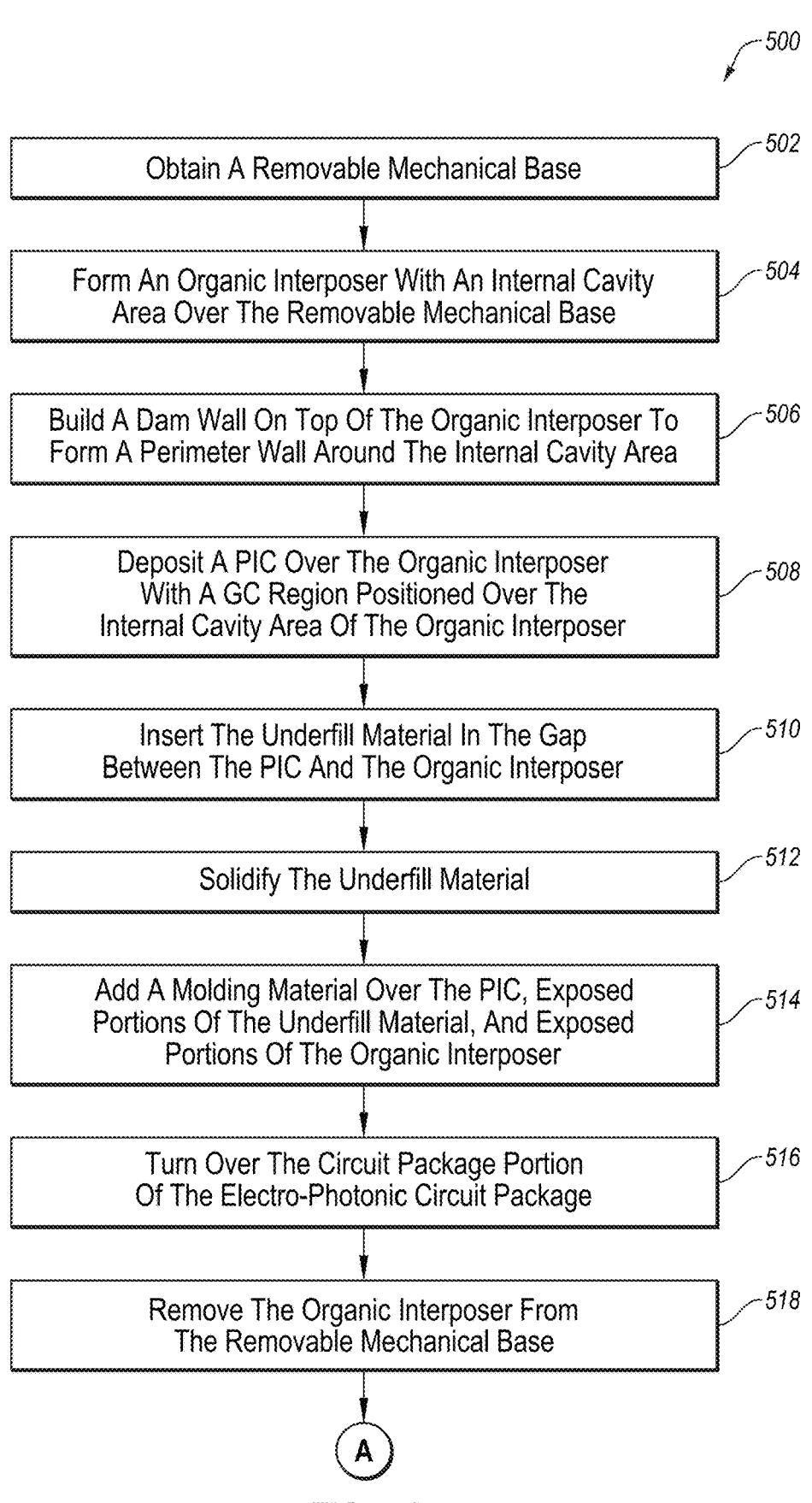

500

Obtain A Removable Mechanical Base 502

Form An Organic Interposer With An Internal Cavity Area Over The Removable Mechanical Base 504

Build A Dam Wall On Top Of The Organic Interposer To Form A Perimeter Wall Around The Internal Cavity Area 506

Deposit A PIC Over The Organic Interposer With A GC Region Positioned Over The Internal Cavity Area Of The Organic Interposer 508

Insert The Underfill Material In The Gap Between The PIC And The Organic Interposer 510

Solidify The Underfill Material 512

Add A Molding Material Over The PIC, Exposed Portions Of The Underfill Material, And Exposed Portions Of The Organic Interposer 514

Turn Over The Circuit Package Portion Of The Electro-Photonic Circuit Package 516

Remove The Organic Interposer From The Removable Mechanical Base 518

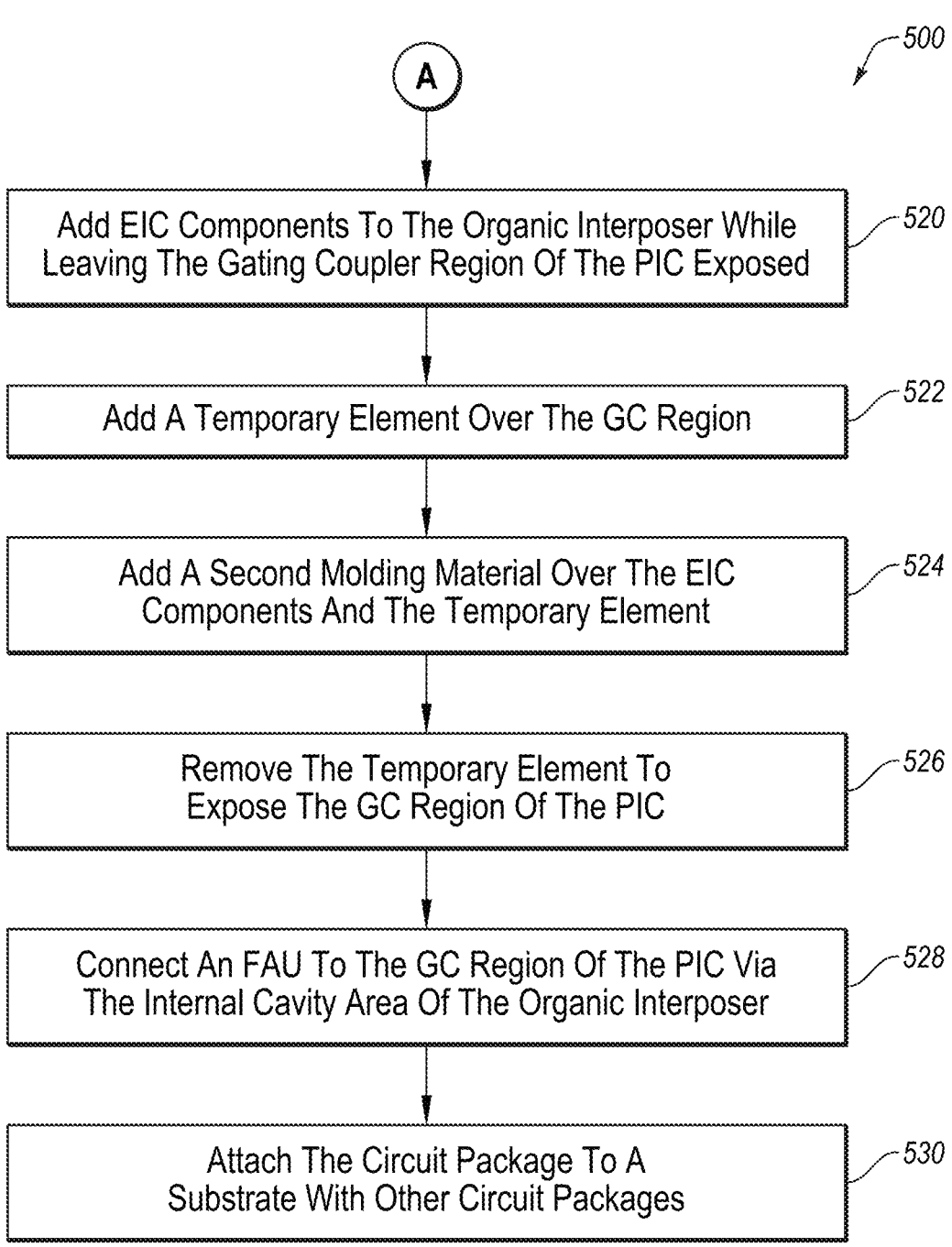

_500_

(A)

Add EIC Components To The Organic Interposer While
Leaving The Gating Coupler Region Of The PIC Exposed   _520_

Add A Temporary Element Over The GC Region   _522_

Add A Second Molding Material Over The EIC
Components And The Temporary Element   _524_

Remove The Temporary Element To
Expose The GC Region Of The PIC   _526_

Connect An FAU To The GC Region Of The PIC Via
The Internal Cavity Area Of The Organic Interposer   _528_

Attach The Circuit Package To A
Substrate With Other Circuit Packages   _530_

*FIG. 5B*

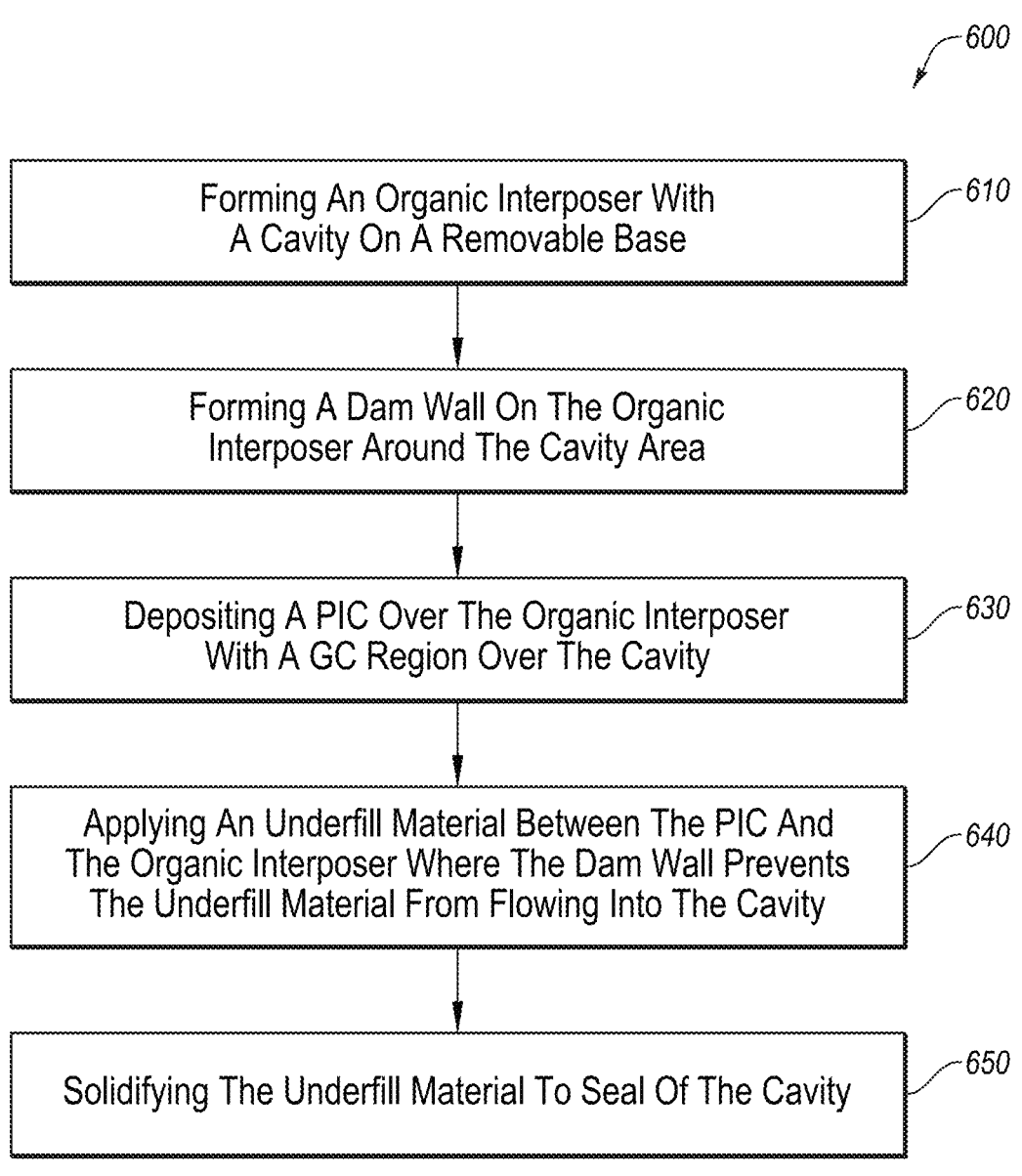

600

Forming An Organic Interposer With
A Cavity On A Removable Base — 610

↓

Forming A Dam Wall On The Organic
Interposer Around The Cavity Area — 620

↓

Depositing A PIC Over The Organic Interposer
With A GC Region Over The Cavity — 630

↓

Applying An Underfill Material Between The PIC And
The Organic Interposer Where The Dam Wall Prevents
The Underfill Material From Flowing Into The Cavity — 640

↓

Solidifying The Underfill Material To Seal Of The Cavity — 650

*FIG. 6A*

PACKAGING OPTICAL COMPONENTS IN A CIRCUIT PACKAGE

CROSS-REFERENCE TO RELATED APPLICATIONS

This application claims priority to U.S. Provisional Patent Application No. 63/655,461, entitled "PACKAGING OPTICALLY ACCESSIBLE COMPONENTS", filed on Jun. 3, 2024, the entirety of which is incorporated herein by reference. This application also claims priority to U.S. Provisional Patent Application No. 63/694,684, entitled "PACKAGING OPTICAL COMPONENTS," filed on Sep. 13, 2024, the entirety of which is incorporated herein by reference.

BACKGROUND

The subject matter discussed in this section should not be assumed to be prior art merely as a result of inclusion in this section. Similarly, any problems mentioned in this section or associated with the subject matter provided as background should not be construed as an admission of prior art.

Integrated circuits (ICs) with processors, especially those designed for executing artificial intelligence and machine learning functions, move large amounts of data among one or more processor ICs and one or more memory ICs. Chiplets may aid in the interconnection of processor dies, memory dies, and other circuits to increase bandwidth and decrease latency and power dissipation in the process. If these interconnections utilize optical elements, maintaining optical pathways through the hardware of a circuit package can become a challenge and present difficulties, particularly in the manufacturing and implementation of IC architectures.

BRIEF DESCRIPTION OF THE DRAWINGS

The following description provides specific and detailed implementations accompanied by drawings. Additionally, each of the figures listed below corresponds to one or more implementations discussed in this disclosure.

FIGS. 1A-1B illustrate an example perspective cross-section of the initial stages of creating a circuit package that includes an organic interposer with an internal cavity area supported by a dam wall.

FIGS. 2A-2B illustrate example perspective views of a circuit package portion showing the internal cavity area within the organic interposer and supported by the dam wall.

FIGS. 5A-5B illustrate an example flow diagram of building a circuit package that includes an organic interposer with an internal cavity area supported by a dam wall, a PIC connected to the organic interposer via electrical components, and an underfill material between the organic interposer and the PIC.

FIGS. 6A-6B illustrate example process flows for packaging a circuit package in which optical access to a GC region is preserved via the internal cavity area in the organic interposer.

DETAILED DESCRIPTION

Figure 1B:
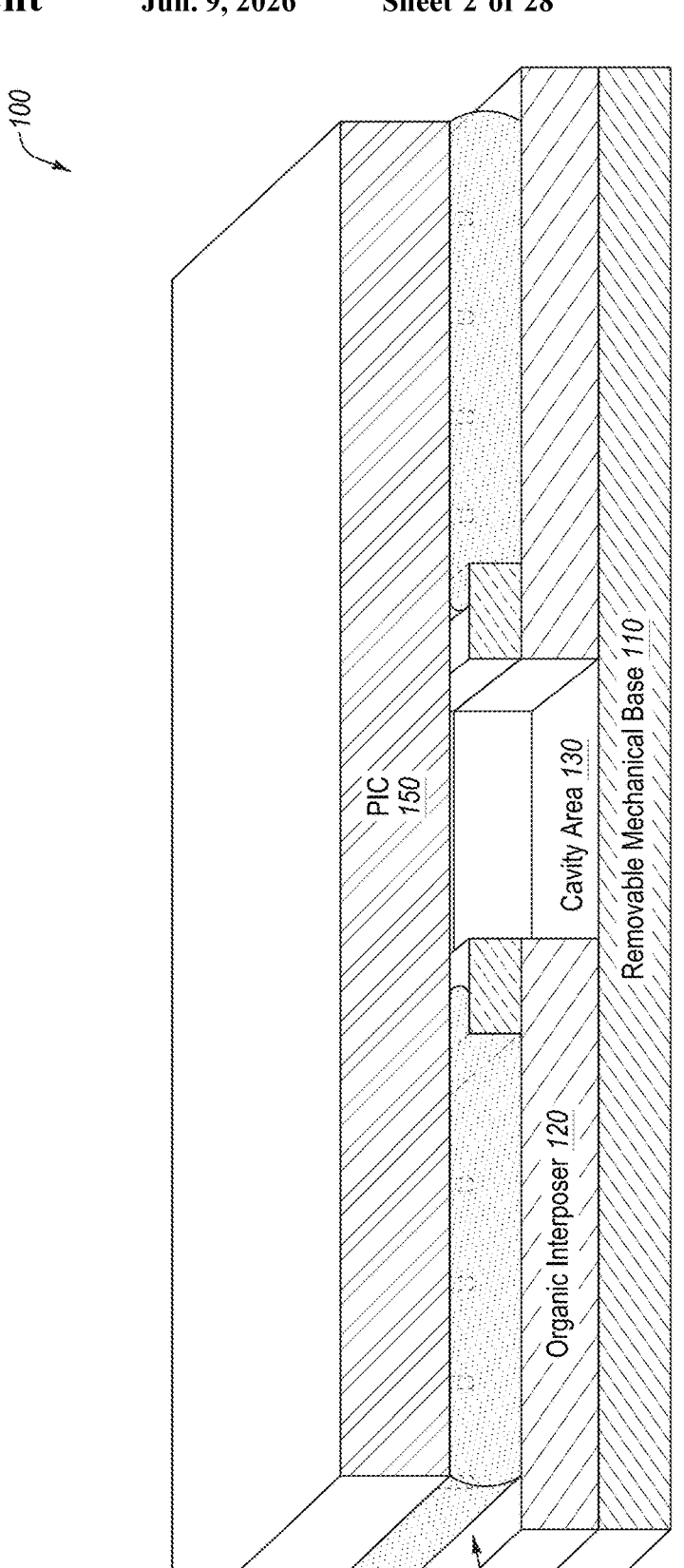

The present disclosure relates to example implementations of optically accessible circuit packages. For example, this disclosure includes implementations for creating a circuit package with a photonic integrated circuit (PIC) connected to electrical integrated circuit (EIC) components via an organic interposer. In many implementations, the circuit package maintains optical access to a gating coupler (GC) region on the PIC via an internal cavity area in the organic interposer. In this way, a fiber array unit (FAU) or other optical connection can couple to the circuit package to communicate data from the EIC components of the circuit package and another circuit package or an external device connected to the FAU (e.g., both send and receive data with the cp) via the open access GC region.

As will be discussed in further detail below, one or more implementations described herein relate to implementations of a circuit package having an organic interposer that allows open access to the GC region of the PIC. In particular, the organic interposer includes an internal cavity area (e.g., an optical window) surrounded by the organic interposer. However, to ensure the internal cavity area remains vacant when applying molding material to the circuit package, the circuit package includes a dam wall and specialized underfill material. As discussed below, the dam wall on the organic interposer extends to or nearly to the PIC, providing a barrier that prevents underfill material from entering the internal cavity area or covering the GC region on the PIC. The underfill material seals off the internal components of the circuit package to prevent molding material from entering the internal cavity area.

To illustrate, in various implementations, a circuit package includes an organic interposer having a top surface and a bottom surface. In some instances, the bottom surface of the organic interposer is attached to the top surface of a removable mechanical base. In many implementations, the organic interposer includes an internal cavity area, creating a hole in the organic interposer, which when included exposes a portion of the removable mechanical base. The organic interposer also includes a dam wall that rises above the top surface of the organic interposer and surrounds the internal cavity area. The circuit package can also include a photonic integrated circuit (PIC) positioned above the organic interposer and attached to the organic interposer with electrical connections (e.g., electrical interconnects). In some instances, a photonically sensitive area of the PIC (e.g., the GC region) is located directly above the internal cavity area of the organic interposer. Furthermore, the circuit package includes an underfill material between the PIC and the organic interposer, where the underfill material does not enter and is absent from the internal cavity area.

As another illustration, in one or more implementations, a circuit package is created, built, formed, or packaged by forming an organic interposer with an internal cavity area (e.g., an optical window). Next, creating the circuit package includes forming a dam wall on the top surface of the organic interposer, where the dam wall surrounds the internal cavity area. For example, the dam wall creates a raised perimeter around the internal cavity area. In addition, creating the circuit package includes depositing a PIC over the organic interposer with the GC region of the PIC positioned over the internal cavity area of the organic interposer and applying an underfill material between the PIC and the organic interposer. Because the dam wall is positioned around the internal cavity area with a raised perimeter, it prevents the underfill material from flowing into the internal cavity area. Further, creating the circuit package includes solidifying the underfill material such that a seal between the PIC and the organic interposer is created around the internal cavity area of the organic interposer.

Additionally, one or more implementations described herein relate to a circuit package having a bidirectional photonic path between optical components in a photonic integrated circuit (PIC) and an optical interface at a top surface (post-package creation) of the circuit package. Existing circuit packages can be difficult and costly to manufacture because the optical interface must be attached to a specific location on the PIC where light enters or exits. Furthermore, the optical interface must be attached to the PIC with a high level of precision. The less-than-ideal locations on the PIC where light enters or exits complicate manufacturing.

In various implementations, the circuit package can be used in an artificial intelligence (AI) accelerator, a bridge, a chiplet, or another configuration that can benefit from coupling photonic links on and off the package or within the package. Implementations include dies that share a common PIC interposer and can communicate via a plurality of intra-chip bidirectional photonic channels. Other implementations include circuit packages that include a die capable of communication with external components via a plurality of inter-chip bidirectional photonic channels, as discussed in further detail below.

Additional example implementations and details of the circuit package (e.g., an optically accessible circuit package or an electro-photonic circuit) are discussed in connection with the accompanying figures, which are described next. For example, FIGS. 1A-1B illustrate an example perspective cross-section of the initial stages of creating a circuit package that includes an organic interposer with an internal cavity area supported by a dam wall according to some implementations. In particular, FIG. 1A shows an initial stage of creating an optically accessible circuit package, and FIG. 1B shows a later stage of creating an optically accessible circuit package.

FIGS. 1A-1B provide a high-level overview of creating the initial portions of a circuit package to illustrate how the circuit package is designed to include an optical window that allows open access to the GC region of the PIC. Further details regarding the creation of a circuit package, along with additional creation stages, are provided below in connection with FIGS. 4A-4N and FIGS. 5A-5B.

As shown, FIG. 1A illustrates a cross-section of a circuit package portion 100 (or the initial formation of a circuit package). The circuit package portion 100 includes a removable mechanical base 110 and an organic interposer 120 built over the removable mechanical base 110. In various implementations, the organic interposer 120 serves as a via for electrical connections passing between components above and below the organic interposer 120 (e.g., the circles on the organic interposer 120 represent electrical connection elements).

The organic interposer 120 may not cover the removable mechanical base 110 in its entirety. To illustrate, the organic interposer 120 shows a cavity area 130 within the middle of the organic interposer 120 (e.g., an internal cavity area). In various implementations, the circuit package portion 100 does not include the removable mechanical base 110, which is designed to be removed at a later stage of creating the circuit package.

The circuit package portion 100 also shows the organic interposer 120 with a dam wall 125 built on the top surface of the organic interposer 120, surrounding the cavity area 130. The dam wall 125 can have an interior wall that complements the interior walls of the organic interposer 120 around the cavity area 130.

Furthermore, because FIG. 1A shows a cross-section of the circuit package portion 100 (e.g., one-half of the circuit package portion), the organic interposer 120 and the dam wall 125 can fully enclose the cavity area 130. Indeed, in many instances, the organic interposer 120 and the dam wall 125 form a perimeter around the cavity area 130, making it an internal cavity area. For example, the cavity area 130 is a hole within the organic interposer 120 that exposes a middle portion of the top surface of the removable mechanical base.

FIG. 1B shows the circuit package portion 100 at a later creation stage. As shown, the circuit package portion shows a PIC 150 attached above the organic interposer 120. In particular, the PIC 150 is attached via electrical connections, shown as black lines between the organic interposer 120 and the PIC 150. The electrical connections link the electrical connection elements on the top surface of the organic interposer 120 with the electrical connection elements on the bottom surface of the PIC 150.

As shown in a later figure, the PIC 150 includes a photonically sensitive area that allows light to enter and exit. In particular, this photonically sensitive region can correspond to a gating coupler (GC) region. In various instances, the GC region is positioned directly above the cavity area 130. Stated differently, the organic interposer 120 is built on the removable mechanical base 110, and the dam wall 125 is constructed on the organic interposer 120 to ensure the GC region of the PIC 150 aligns with the cavity area 130.

In some implementations, the PIC 150 directly sits flush on top of the dam wall 125 (e.g., no gap). However, seating the PIC 150 on the dam wall 125 may result in insufficient clearance for the electrical connections between the organic interposer 120 and the PIC 150. Indeed, due to the microscale of the circuit package, creating a circuit package with the PIC flush against the top of the dam wall is often infeasible. Accordingly, in many implementations, joining the PIC 150 to the organic interposer 120 prioritizes the electrical connections, and when the electrical connections are connected between the organic interposer 120 and the PIC 150, a small gap may remain between the bottom surface of the organic interposer 120 and the top surface of the dam wall 125, as shown in FIG. 1B.

As shown, FIG. 1B also shows an underfill 140 (e.g., an underfill material) between the PIC 150 and the organic interposer 120. The underfill 140 solidifies the PIC 150, the electrical connections, and the organic interposer 120 within the circuit package portion 100. As also shown, the underfill 140 does not enter the cavity area 130.

To elaborate, the underfill 140 is made of a material with a viscosity value low enough to allow it to flow into the larger (e.g., taller) gap between the PIC 150 and the organic interposer 120, surrounding the electrical connections. Furthermore, the viscosity value of the underfill material is such that when entering the smaller gap between the top surface of the dam wall 125 and the bottom surface of the PIC 150, the underfill 140 will clog and not progress into the cavity area 130 or cover the GC region of the PIC 150.

In addition to solidifying the components of the circuit package portion 100, the underfill 140 may also be necessary to prevent molding material from entering the cavity area 130. For example, the underfill 140 forms a seal around the cavity area 130. When the cavity area 130 is an internal cavity area, the seal created by the underfill 140 completely surrounds the cavity area 130. Thus, adding molding material on top of the circuit package portion 100 may further solidify the components, but will isolate them from the cavity area 130.

As described in later figures, the circuit package portion 100 may be completed into a circuit package by removing the removable mechanical base 110 and adding EIC components to the organic interposer 120 on the side opposite the cavity area 130. Removing the removable mechanical base 110 creates open access to the GC region of the PIC 150 via an optical window and allows an FAU to be directly attached to the GC region, as further described below. As used herein, an EIC component refers to any electrical or hardware component that may be included within an EIC layer of a circuit package. Non-limiting examples of EIC components may optically include analog mixed signal (AMS) blocks, photonic transceivers, drivers (e.g., modulator drivers), sensors (e.g., temperature sensors, light sensors, voltage sensors), regulators (e.g., voltage regulators, temperature regulators), interconnects, power management units (PMUs), modulators, demodulators, interfaces (e.g., input/output (I/O) interfaces, electro-photonic interfaces) as well as other hardware components. Additional examples of EIC components are discussed in connection with illustrated examples.

Figure 2A:
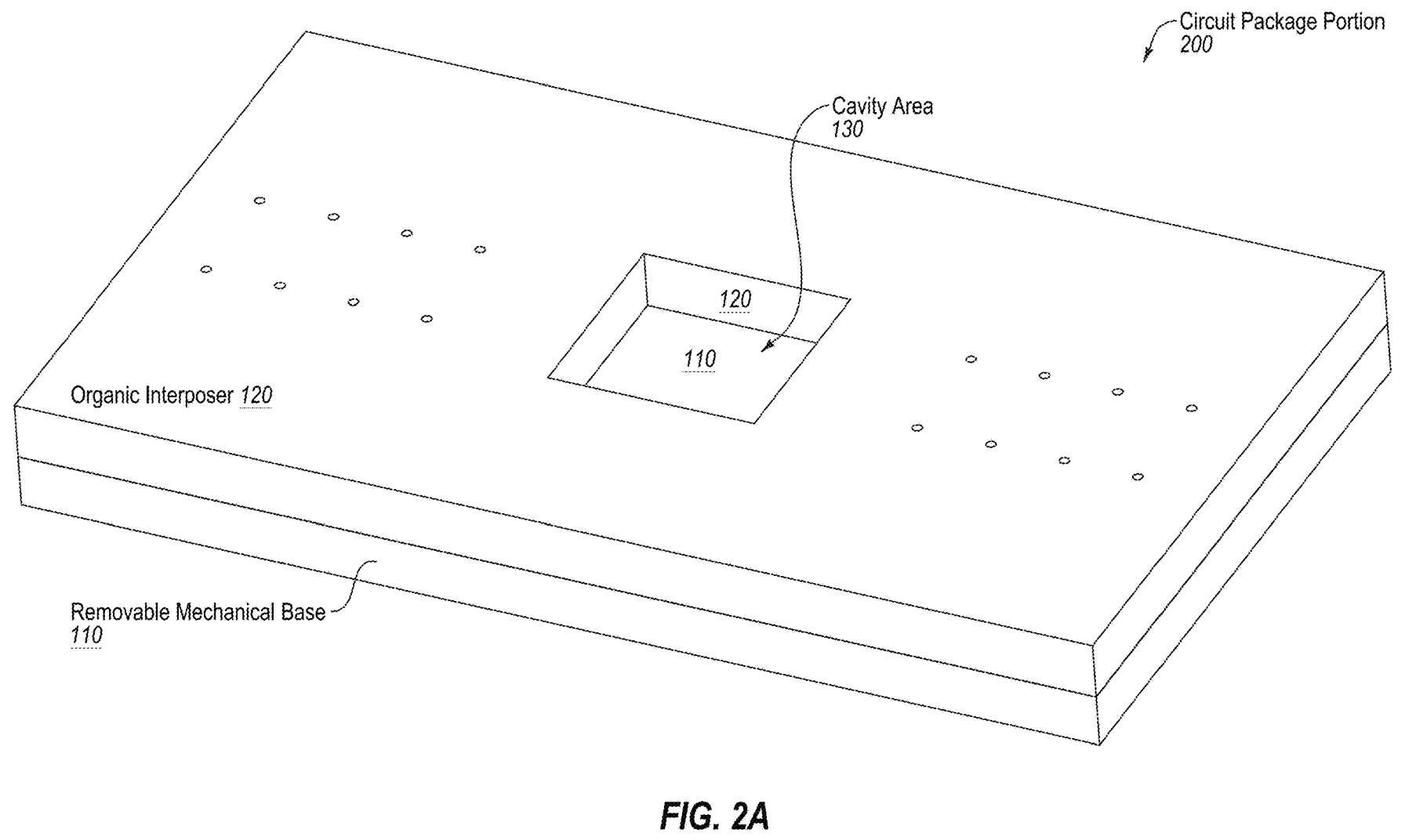
Figure 2B:
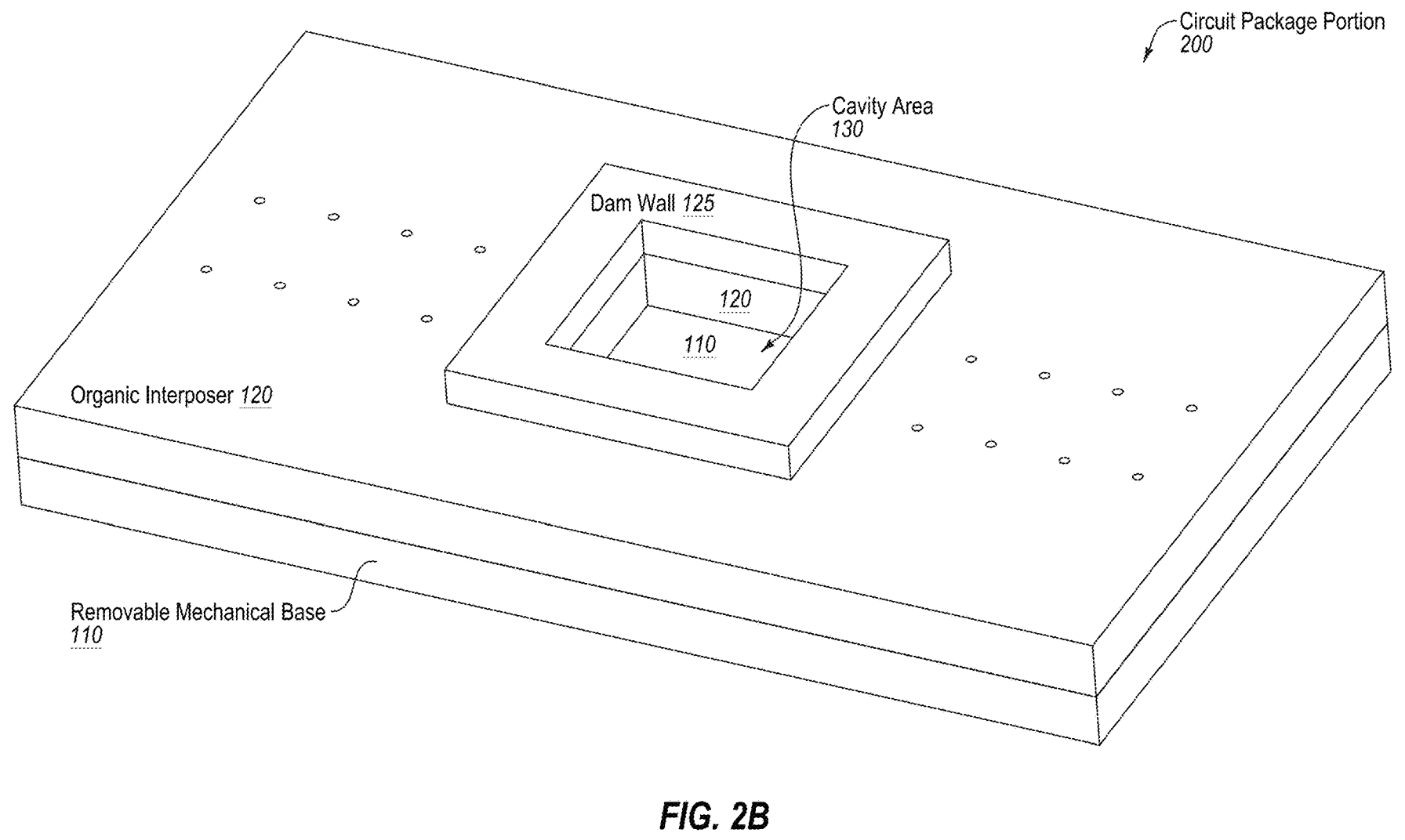

FIGS. 2A-2B illustrate example perspective views of a circuit package portion showing the internal cavity area within the organic interposer and supported by the dam wall according to some implementations. In particular, FIG. 2A includes a circuit package portion 200 with the organic interposer 120 stacked on the removable mechanical base 110, and the organic interposer 120 having an internal void area that creates the cavity area 130. Indeed, the cavity area 130 exposes the top surface of the removable mechanical base 110 in the middle of the organic interposer 120.

FIG. 2B shows a perspective view of the circuit package portion 200 with a dam wall 125 built upon the top surface of the organic interposer 120, which further protects the cavity area 130. As shown, the dam wall 125 forms a perimeter wall or barrier around the cavity area 130 (e.g., an internal cavity area).

In various implementations, the dam wall 125 may be rectangular (e.g., a rectangle or square), oval (e.g., an oval or circle), irregular, or another shape, so long as the dam wall 125 creates an enclosed space around the cavity area 130. Additionally, in some instances, the dam wall 125 may be located at a side edge or corner of the organic interposer 120. In these instances, the dam wall 125 may omit a side wall along the open edge of the organic interposer 120 or omit two walls if located at a corner of the organic interposer 120, provided the remaining sides of the dam wall enclose and protect the cavity area 130 from filling with a fluid material that flows across the top surface of the organic interposer 120.

Figure 3A:
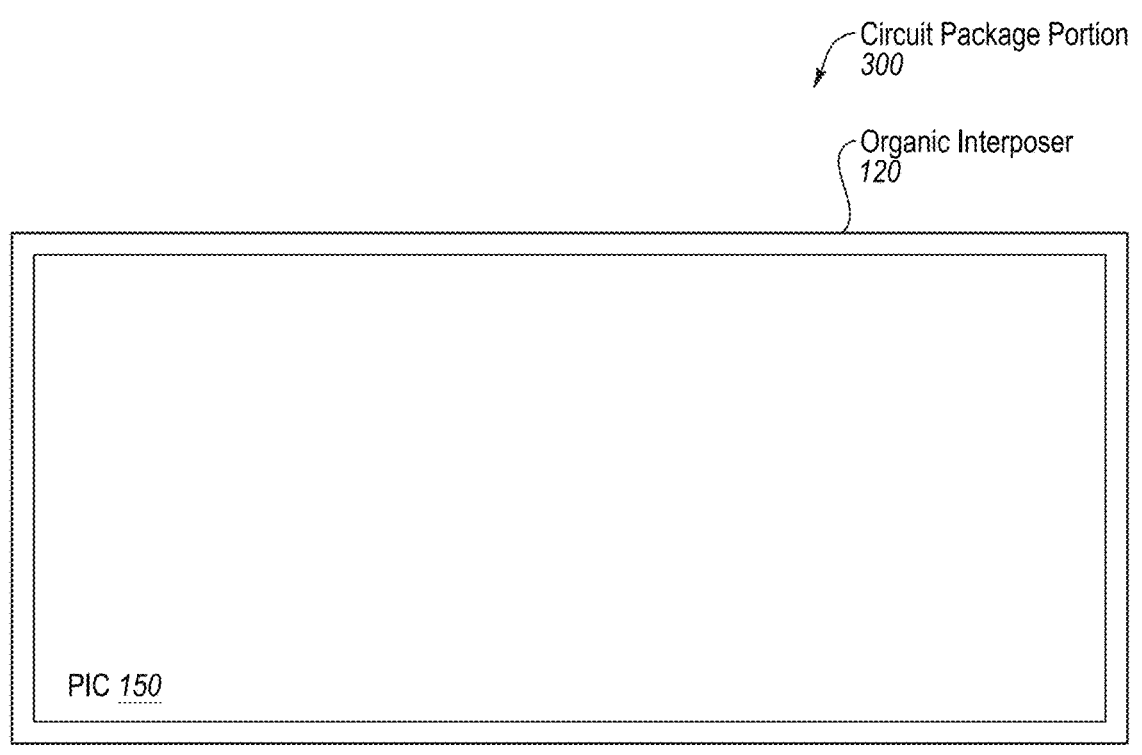
FIGS. 3A-3B illustrate an example top view of a circuit package portion and a flipped circuit package, which shows the internal cavity area of the organic interposer providing open access to the GC region of a photonic integrated circuit (PIC).
Figure 3B:
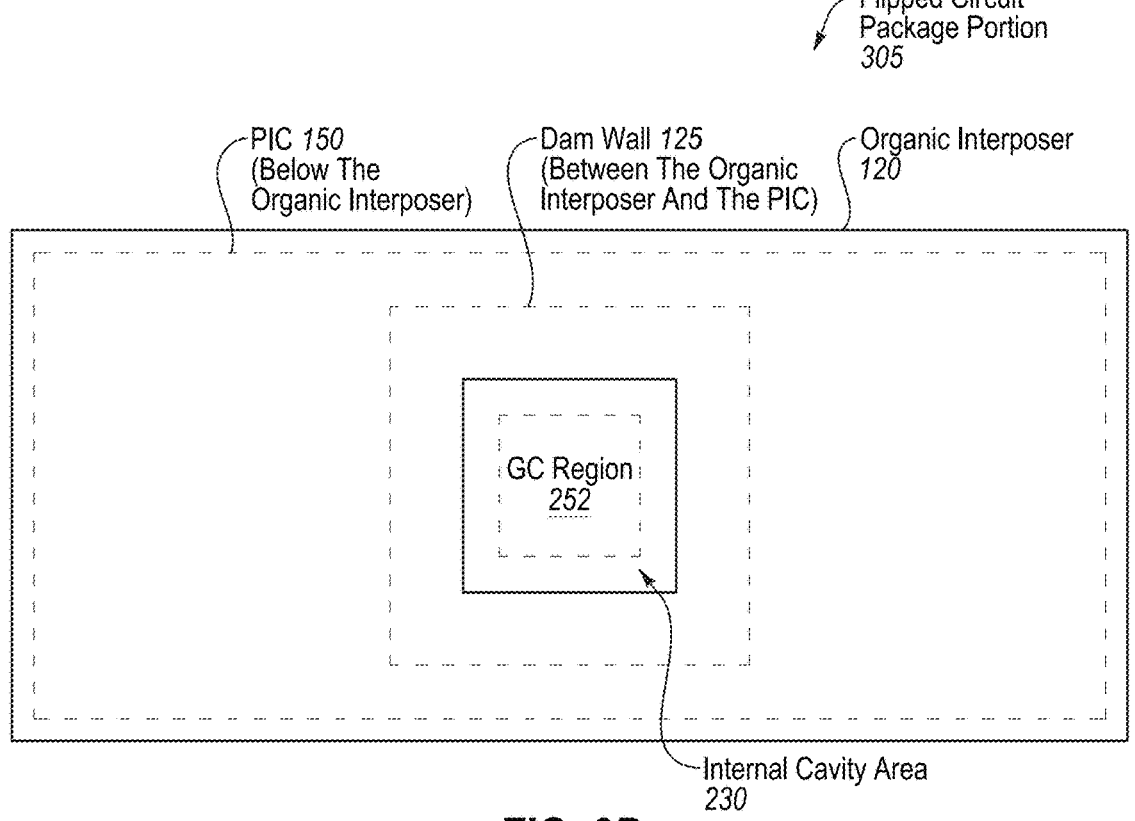

FIGS. 3A-3B illustrate a two-dimensional top view of a circuit package portion that includes a PIC (e.g., an electro-photonic circuit package). In particular, FIGS. 3A-3B illustrate an example top view of a circuit package and a flipped circuit package portion, which shows the internal cavity area of the organic interposer providing open access to the GC region of a PIC according to some implementations.

As shown, FIG. 3A shows the top view of a circuit package portion 300 that includes a PIC 150 stacked on top of an organic interposer 120. The circuit package portion 300 may include a dam wall between the organic interposer 120 and the PIC 150. Furthermore, there may be a small gap between the top of the dam wall and the bottom surface of the PIC 150.

To better illustrate, FIG. 3B flips the circuit package portion 300 to show a top view of the flipped circuit package portion 305. In FIG. 3B, the flipped circuit package portion 305 shows the organic interposer 120 on top of a now hidden instance of the PIC 150 (represented by dashed lines). Again, the dam wall 125 may be attached to the organic interposer 120 and located between the organic interposer 120 and the PIC 150. To aid in understanding, the location of the dam wall 125 is indicated by a dashed line.

In particular, the flipped circuit package portion 305 shows an internal cavity area 230 created in the organic interposer 120 and protected by the dam wall 125. Indeed, the internal cavity area 230 provides open access to a portion of the PIC 150 via an optical window. More specifically, the internal cavity area 230 provides open access to a GC region 252 of the PIC 150, as shown.

In some implementations, a fiber array unit (FAU) or other optical connection is attached to the GC region 252 of the PIC 150. By having a hole in the organic interposer 120, the FAU can connect to the PIC 150, enabling the sending and receiving of data in the form of light between circuit packages and/or external devices.

Figure 4A:
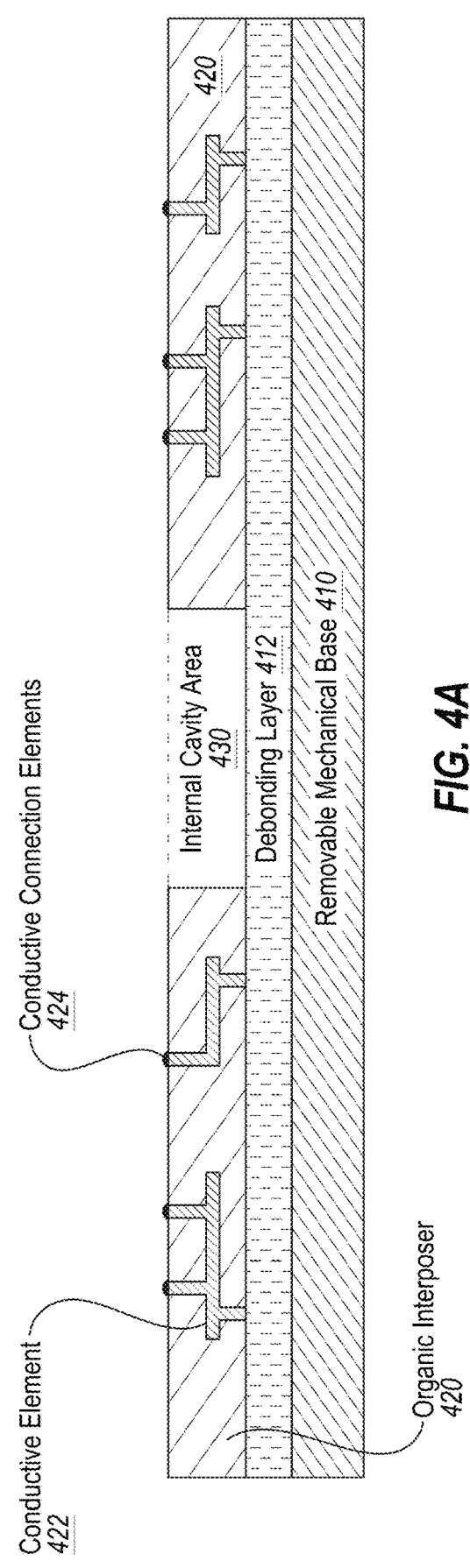
FIGS. 4A-4N illustrate example views showing stages of packaging a circuit package that preserves optical access to a grating coupler (GC) region on a PIC via an organic interposer with an internal cavity area supported by a dam.

Additional detail is now provided regarding creating a circuit package (an electro-photonic circuit package). In particular, FIGS. 4A-4N show a component-based approach for building a circuit package, while FIGS. 5A-5B describe a process-based approach for building a circuit package. Accordingly, FIGS. 4A-4N provide details about the components used to generate the circuit package, while FIGS. 5A-5B outline the packaging process.

As mentioned above, FIGS. 4A-4N show a component-based approach for building a circuit package (e.g., an electro-photonic circuit package). Specifically, FIGS. 4A-4N illustrate example views showing stages of packaging a circuit package that preserves optical access to a grating coupler (GC) region on a PIC via an organic interposer with an internal cavity area supported by a dam according to some implementations.

As noted above, FIGS. 4A-4N provide details about the components used to generate the circuit package while preserving optical access to a grating coupler (GC). For clarity, a two-dimensional representation of the circuit package 400 is shown. However, as indicated above, the circuit package 400 is three-dimensional and includes one or more internal cavity areas surrounded by an organic interposer.

As discussed above, preserving an area around the GC region or area enables one or more optical interfaces to be connected to electrical and/or optical components on a PIC of the circuit package. Indeed, maintaining a photonic path to a GC provides a convenient mechanism for connecting an optical interface, such as an FAU to the GC, which provides a communication path whereby electrical components can communicate off-chip via a bidirectional photonic channel.

To begin, FIG. 4A includes a circuit package 400, which includes a removable mechanical base 410, a debonding layer 412, and an organic interposer 420. The organic interposer 420 includes conductive elements 422 and electrical connection elements 424 (e.g., conductive connection elements). In addition, the organic interposer 420 includes an internal cavity area 430. While the organic interposer 420 is shown on both sides of the internal cavity area 430, in many implementations, the organic interposer 420 fully surrounds the internal cavity area 430, as indicated by the dashed line connecting the two portions of the organic interposer 420 shown. In some implementations, the internal cavity area 430 is located at an edge or corner of the organic interposer 420, creating a perimeter around each side of the internal cavity area 430, except for the open edge or edges.

The removable mechanical base 410 may be a substrate and/or wafer made from a variety of materials. For example, the removable mechanical base 410 can be a glass carrier. In some implementations, the removable mechanical base 410 may be another type of organic carrier, such as a ceramic substrate, an epoxy substrate, a silicon substrate, or a metal substrate. Regardless of the material of the removable mechanical base 410, the base should provide a stable foundation during the initial packaging stages and then be removable without damaging the circuit package.

The organic interposer 420 may be a redistribution layer (RDL) or another material. For example, the organic interposer 420 is made of organic dielectrics, silicon dioxide, silicon nitride, polymer-based materials, and/or glass. In some implementations, the organic interposer 420 is made of a combination of nonconductive and conductive materials, where the conductive materials form the conductive elements 422.

In various implementations, the conductive elements 422 of the organic interposer 420 form vias that provide mechanisms whereby components on the same surface, on opposite surfaces, or between layers of the organic interposer 420 may connect and communicate. In some implementations, the electrical connection elements 424 (e.g., electrical contacts) include under bump metallization (a "ubump") or another element that forms a thin pad for connecting electrical connections (e.g., solder bumps, pins, solder balls, or wires). In some implementations, the electrical connection elements 424 slightly protrude above the top surface of the organic interposer 420 by a preconfigured amount.

As shown, the organic interposer 420 attaches to the removable mechanical base 410 via a debonding layer 412. In various implementations, the debonding layer 412 is a debonding adhesive layer. The debonding layer 412 can include various adhesive types, such as hot melt adhesives, reactive adhesives, pressure-sensitive adhesives, or bio-based adhesives.

In various implementations, the organic interposer 420 matches the length and depth dimensions of the removable mechanical base 410. In some implementations, the organic interposer 420 is smaller than the removable mechanical base 410 in at least one dimension. In certain implementations, the organic interposer 420 is larger than the removable mechanical base 410 in at least one dimension.

As mentioned above, the organic interposer 420 includes a cavity or opening, forming the internal cavity area 430. In some instances, the location is determined based on an expected location of a GC region on a corresponding PIC or other interposer, which will be placed over the organic interposer 420. While FIG. 4A shows a single opening, the organic interposer 420 may include any number of openings/cavities based on any number of GC regions that may be included on a PIC. Additionally, FIG. 4A may represent a portion of the organic interposer 420, which, in many instances, includes many additional components and/or cavities and other features spaced across a region of the organic interposer 420.

As noted above, in one or more implementations, lithography is used to generate the pattern or patterns of the organic interposer 420. In various implementations, lithography includes transferring a pattern from a photomask to the surface by adding coatings and etching out patterns.

Figure 4B:
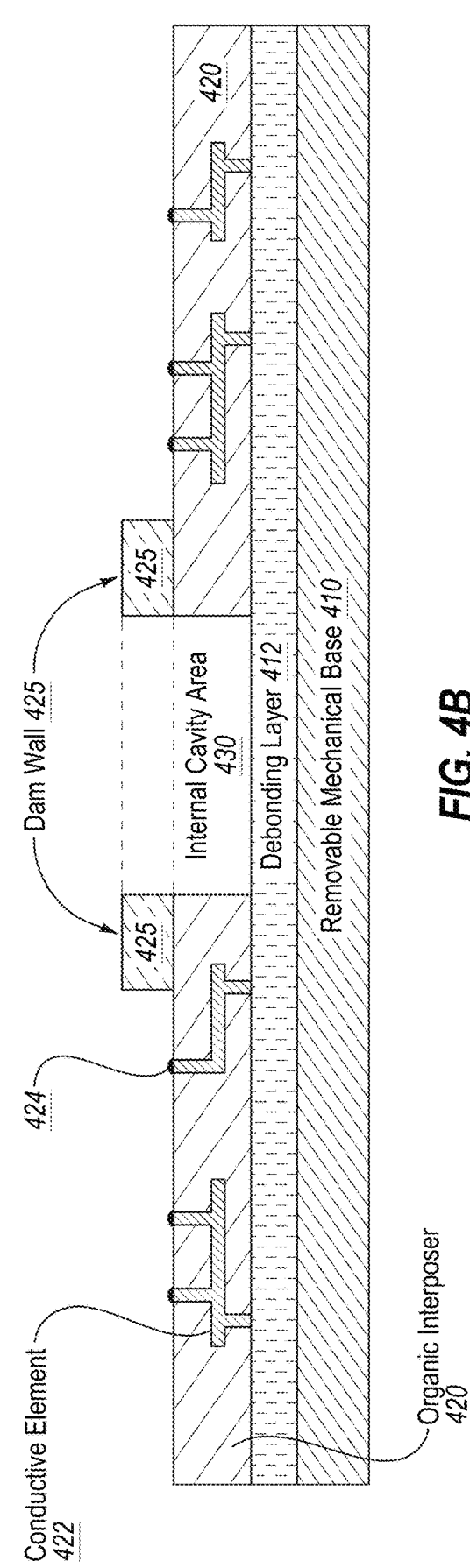

FIG. 4B adds a dam wall 425 to the top surface of the organic interposer 420. As shown, the dam wall 425 is placed on the organic interposer 420 to form an additional perimeter wall above and around the internal cavity area 430. The dam wall 425 fully surrounding the internal cavity area 430 is indicated by the dashed lines connecting the two sides of the dam wall. Indeed, in various implementations, the dam wall serves as an additional mask layer around a window or perimeter of the opening or cavity within the organic interposer 420. The dam wall perimeter may form a variety of shapes or dimensions, such as a rectangular or circular dam around the internal cavity area 430.

In various implementations, the dam wall 425 has square-like dimensions. For example, the dam wall 425 is 10-15 microns high and approximately the same width. In some implementations, the dam wall 425 is rectangular, causing the top surface to be wider than the wall is tall. For example, the dam wall 425 may be 15 microns high and 20 microns wide (or 10 microns high and 15 microns wide). While the dimensions of the dam wall 425 may vary, the dam wall should be sufficiently tall and wide so that the underfill material will clog before entering the internal cavity area 430.

As mentioned above, in various implementations, the dam wall 425 has an internal wall that is flush with the internal organic interposer wall, as shown. In some instances, the dam wall 425 is offset away from the internal organic interposer wall. In some instances, the dam wall 425 overhangs the internal organic interposer wall.

Figure 4C:
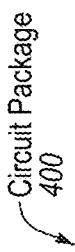

FIG. 4C adds a PIC 450 to the circuit package 400. For example, once the dam wall 425 is formed around the internal cavity area 430, a PIC 450 may be placed over the organic interposer 420, with a GC region 452 directly over the internal cavity area 430. In particular, the PIC 450 may be placed in contact with or connected to the electrical connection elements 424 of the organic interposer 420 via electrical connections 454. For instance, the electrical connections 454 are attached to the electrical connection elements 424 of the organic interposer 420 and the corresponding electrical connection elements of the PIC 450.

The PIC 450 may include various components and elements. For example, the PIC 450 includes one or more drivers and transimpedance amplifiers. The PIC 450 may also include waveguides and/or vias (e.g., TSVs) that provide connectivity and/or power to the electrical components via a power source that is coupled to the electrical components through the PIC 450.

In a few implementations, upon connecting the electrical connections 454 (e.g., via a heat-sinking or other processes described above), the PIC 450 sits flush on the dam wall 425. More commonly, upon connecting the electrical connections 454, the PIC 450 sits above the top surface of the dam wall 425, as shown. Indeed, FIG. 4C shows a small opening, gap, or spacing between the bottom surface of the PIC 450 and the top surface of the dam wall 425. In one or more implementations, the resulting spacing between the PIC 450 and the dam wall 425 is a few microns (e.g., less than 10 microns).

Regarding spacing, the distance between the bottom surface of the PIC 450 and the top surface of the dam wall 425 may be referred to as the small gap. Additionally, the distance between the bottom surface of the PIC 450 and the larger top surface of the organic interposer 420 may be referred to as the large gap. In some implementations, the large gap is 20 microns, while the small gap is 5 microns. Indeed, the large gap may range from 20-50 microns, while the small gap may range from 5-10 microns.

As discussed in this document, the spacing may correspond to a specific gap thickness that matches the viscosity of an underfill material to be applied between the PIC 450 and a portion of the organic interposer 420. For example, the spacing between the PIC 450 and the dam wall 425 is determined or designed based on a known or expected viscosity of the underfill material, ensuring that the underfill material, when applied, flows into the large gap and potentially through at least a portion of the small gap, but does not flow into the internal cavity area 430 of the organic interposer 420 or over the GC region 452 of the PIC 450.

Figure 4D:
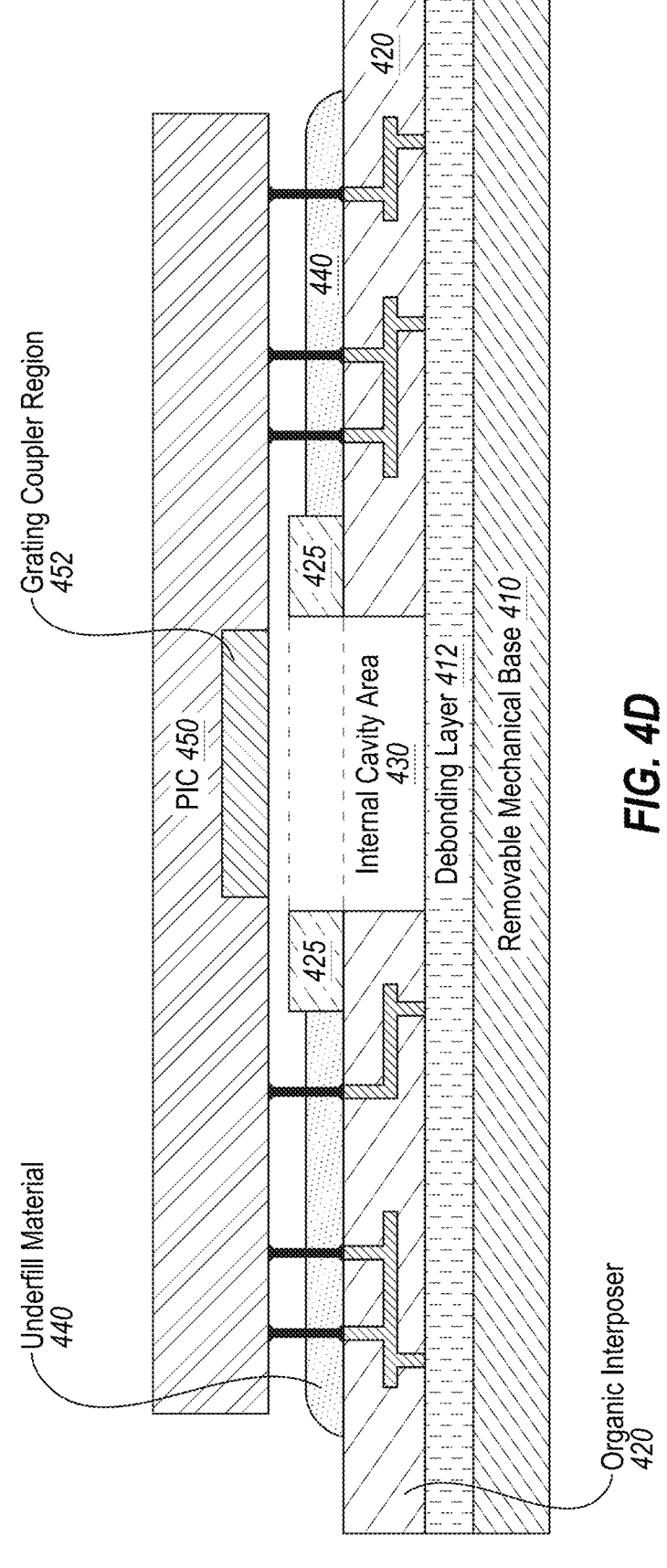

To further illustrate, FIG. 4D shows the initial application of an underfill material 440 to the large gap between the bottom surface of the PIC 450 and the large top surface of the organic interposer 420. While the PIC 450 is positioned over the organic interposer 420 with the GC region 452 of the PIC 450 aligned over the internal cavity area 430, the underfill material 440 may be applied over a portion of the organic interposer 420. As shown, the underfill material 440 flows across the top surface of the organic interposer 420 and beneath the bottom surface of the PIC 450.

Because the dam wall 425 and the internal cavity area 430 are located in the center of the circuit package 400, the underfill material 440 may begin to fully surround the dam wall 425. When the dam wall 425 abuts an edge or corner of the organic interposer 420, the underfill material 440 may surround the relevant dam walls.

Figure 4E:
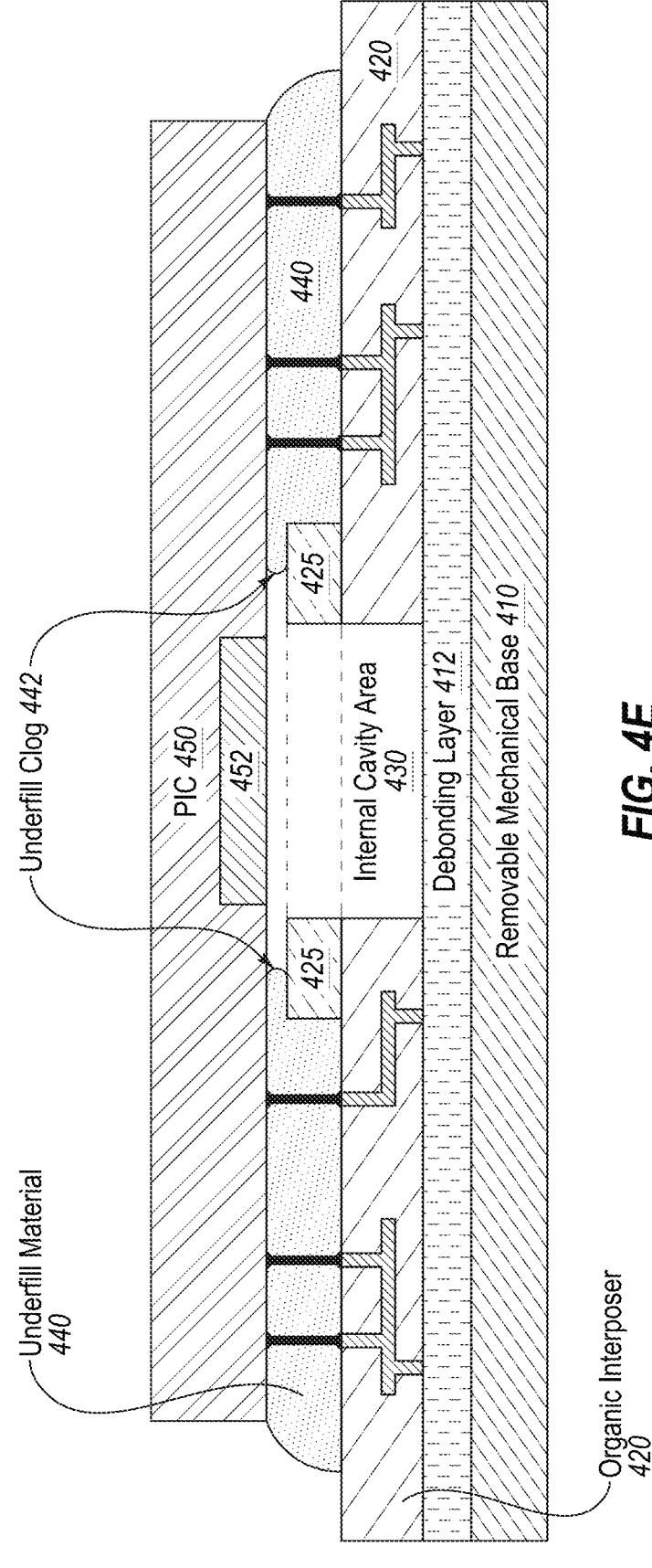

FIG. 4E shows the underfill material 440 fully filling the large gap between the organic interposer 420 and the PIC 450. Additionally, the underfill material 440 begins to enter the small gap between the dam wall 425 and the PIC 450. As shown, the underfill material 440 begins to clot due to the small vertical space between the bottom surface of the PIC 450 and the top surface of the dam wall 425, combined with a sufficient dam wall width. The resulting clot forms an underfill clog 442, which prevents the underfill material 440 from entering the internal cavity area 430 of the organic interposer 420 or covering the GC region 452 of the PIC 450.

The underfill may be made using a variety of materials. In one or more cases, the underfill is a polymer material having a viscosity that enables the underfill material to flow between the PIC 450 and the organic interposer 420 while halting or preventing the underfill from flowing over the dam wall 425 into the internal cavity area 430. Indeed, in one or more implementations, the underfill material 440 has a range of viscosity values that enables the underfill material 440 to fill the large space between the PIC 450 and the dam wall 425 without entering the internal cavity area 430. For example, in some implementations, the viscosity is determined at least in part based on the small gap between the PIC 450 and the dam wall 425, such that the underfill material 440 clogs when flowing into the small gap, preventing it from entering the internal cavity area 430.

In various implementations, the underfill material 440 is a polymer-based material, such as an epoxy or resin. In some implementations, the underfill material 440 may also be a metal material, a silicon material, an acrylic material, or a molded material capable of being deposited between the PIC 450 and the organic interposer 420.

In some implementations, the underfill material 440 covers the entire top surface of the organic interposer 420 (excluding the internal cavity area 430). In various implementations, the underfill material 440 leaves a portion of the top surface of the organic interposer 420 exposed.

Furthermore, the underfill material 440 may be cured or solidified between the organic interposer 420 and the PIC 450, covering the electrical connections 454, as described above. For example, the underfill material 440 is solidified using chemical curing.

Figure 4F:
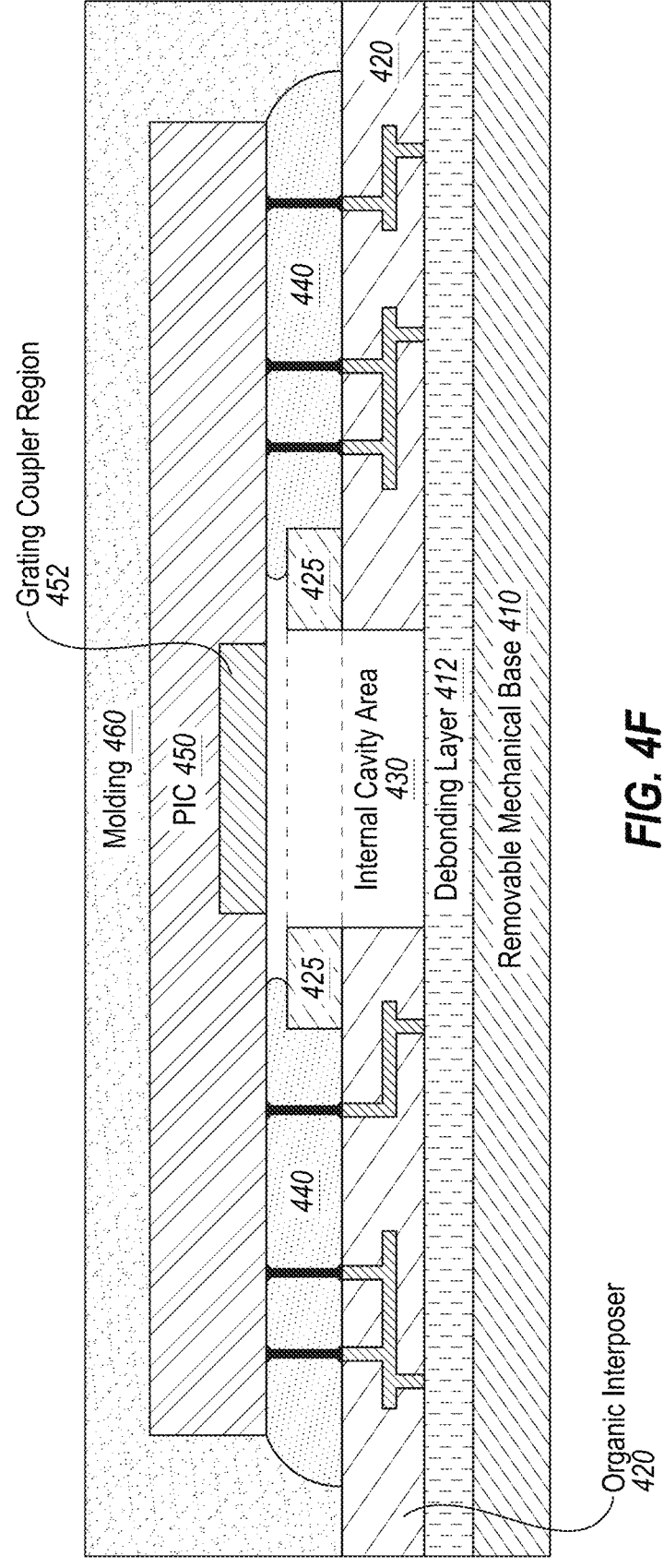

FIG. 4F adds molding 460 over the circuit package 400. For example, a molding material is applied over the exposed portions of the organic interposer 420, the underfill material 440, and/or the PIC 450. As shown, the molding 460 covers the PIC 450 and other exposed top surfaces. Because the internal cavity area 430 is sealed off by the underfill material 440 (e.g., it is not exposed), the molding material does not enter the internal cavity area 430.

In one or more implementations, the molding 460 has a higher coefficient of thermal expansion than the underfill material 440, enabling the underfill material to be deposited first to provide a seal against the molding material entering the internal cavity area 430 beneath the GC region 452 of the PIC 450. In these implementations, the lower coefficient of thermal expansion of the underfill material 440 may assist in providing an effective seal to the internal cavity area 430 without requiring that the PIC 450 directly contact the dam wall 425, potentially damaging one or both hardware components.

In various implementations, the molding material or compound is made from a variety of materials. For example, the molding material includes epoxy molding compounds (EMC), silicone, polyimide, thermoplastic compounds, and liquid crystal polymers (LCP). The molding compound may include the same or different materials as the underfill material 440.

In some instances, the molding material is ground down to remove excess material. For example, the molding material is ground down to expose the PIC 450. This allows components to be added to the PIC 450 at a later stage.

Figure 4G:
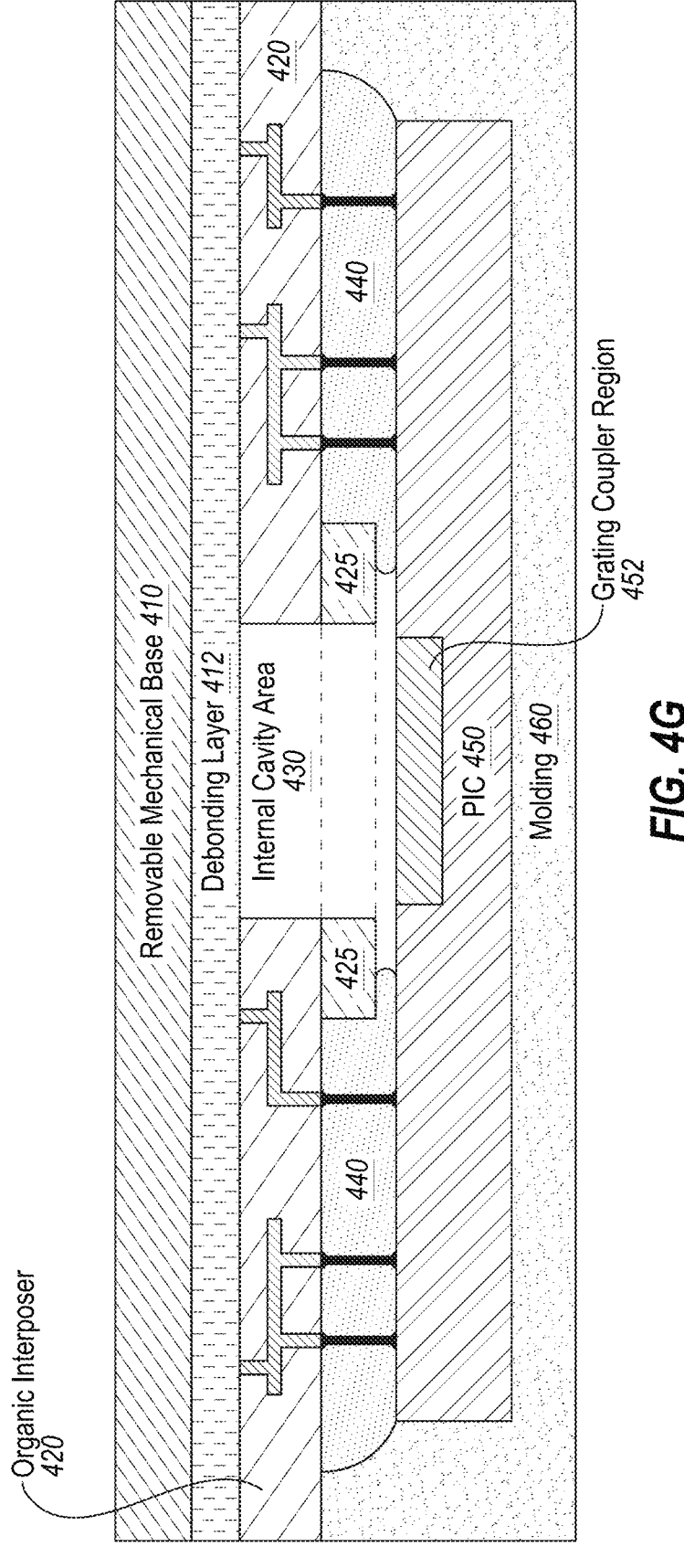

FIG. 4G shows preparing to remove the removable mechanical base 410. For example, upon solidifying the top components of the circuit package 400, the circuit package 400 is flipped to position the removable mechanical base 410 on top. Flipping the circuit package 400 switches the orientations of the top surface and bottom surface of the circuit package 400.

Figure 4H:
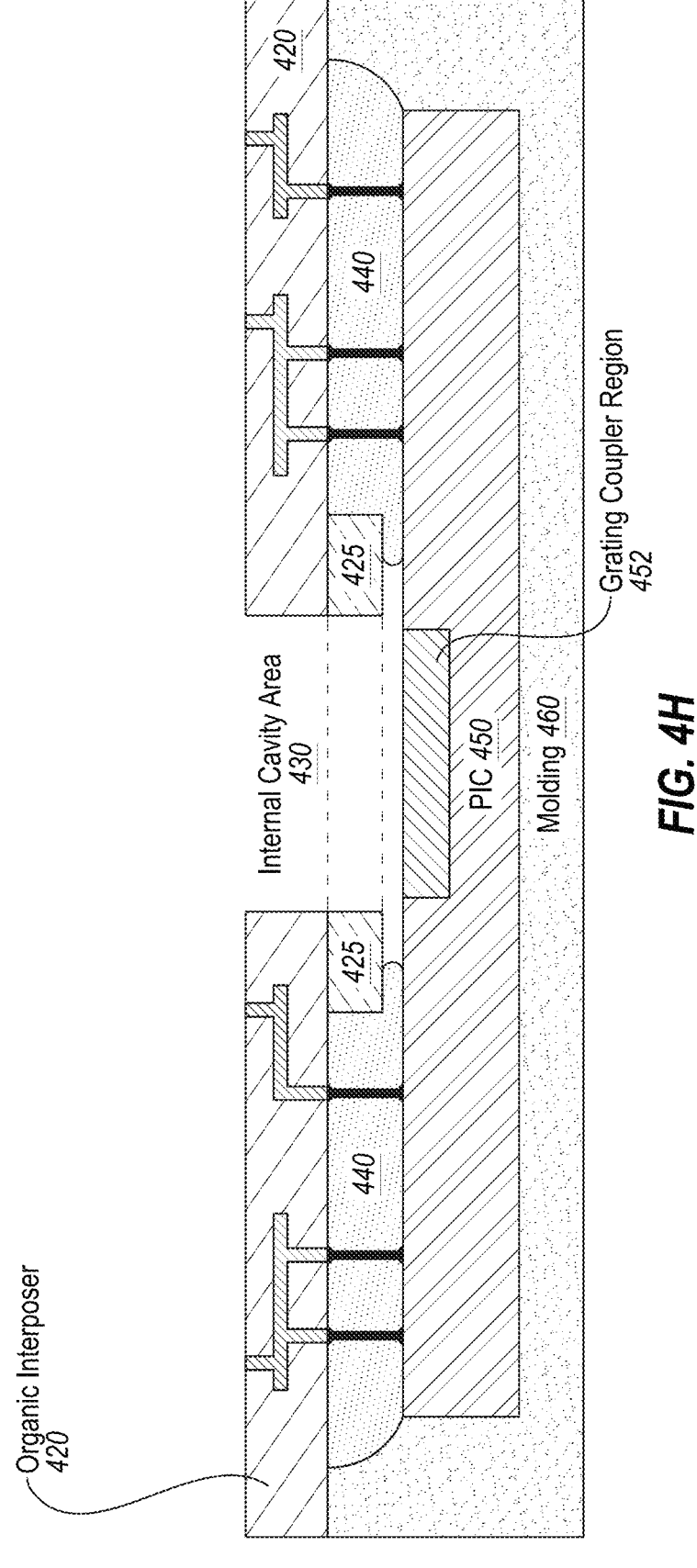

FIG. 4H shows removing the removable mechanical base 410. In various implementations, upon flipping the circuit package 400, the removable mechanical base 410 is taken off. For instance, the removable mechanical base 410 is de-bonded from the organic interposer 420 by deactivating the debonding layer 412. With the removable mechanical base 410 removed, the internal cavity area 430 becomes exposed, providing open access to the GC region 452 of the PIC 450 via an optical window.

Figure 4I:
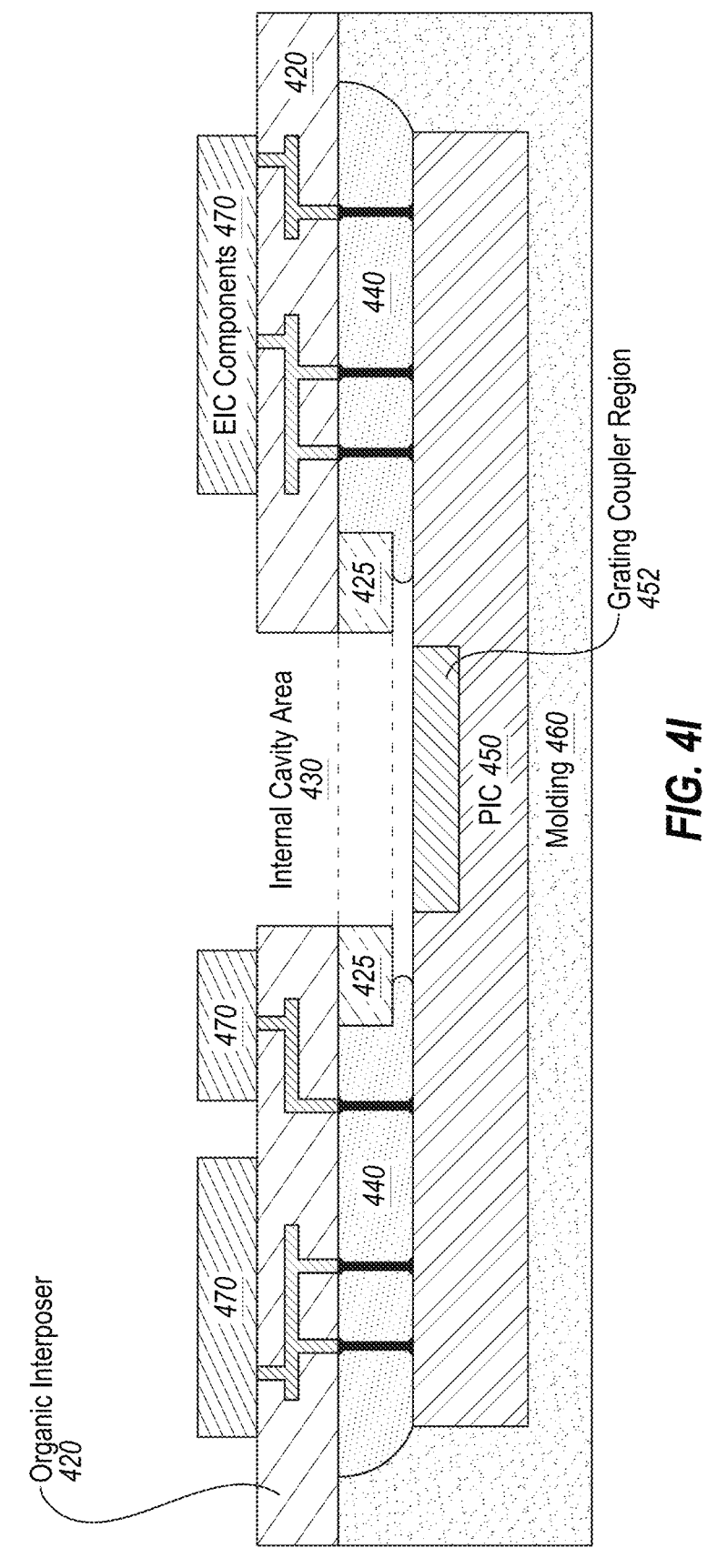

FIG. 4I shows adding EIC components 470 to the organic interposer 420. For instance, one or more of the EIC components 470 (e.g., electrical components such as processing elements, memory, etc.) are added to the top surface of the organic interposer 420. In some implementations, an RDL and/or electrical connections are used to connect the EIC components 470 to the organic interposer 420. As described above, the organic interposer 420 allows the EIC components 470 (e.g., electrical components such as an ASIC, high-bandwidth memory, etc.) to be in electronic communication with components of the PIC 450. In particular, the EIC components 470 are added in such a manner that the internal cavity area 430 remains open, maintaining a photonic path to the GC region 452 of the PIC 450. In various implementations, adding the EIC components 470 transforms the circuit package 400 into an electro-photonic circuit package.

Figure 4J:
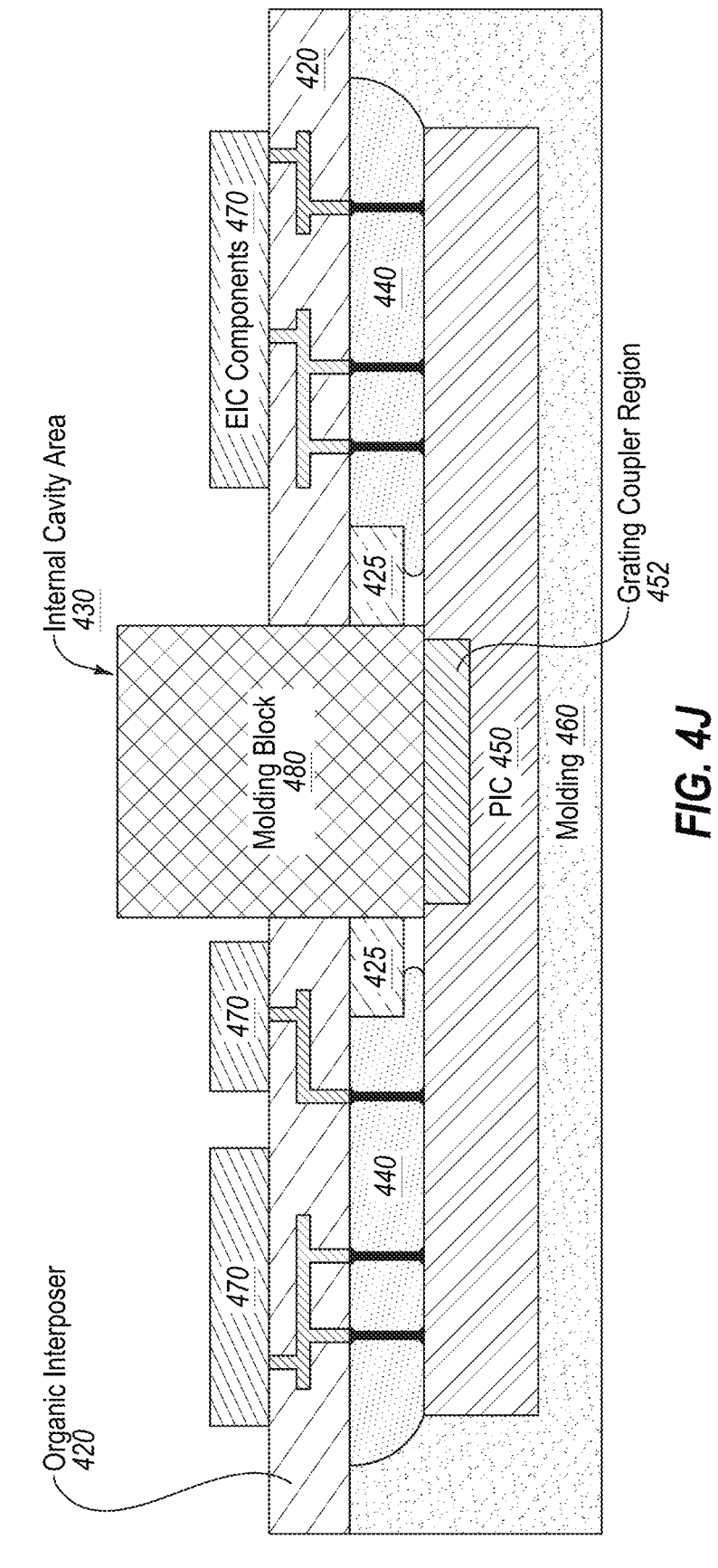

FIG. 4J shows adding a molding block 480 to the internal cavity area 430. The molding block 480 may be a pre-form mold, glass block, or cap attachment that covers the GC region 452 of the PIC 450. In some implementations, the molding block 480 is a type of dummy block or sacrificial glass block. In various implementations, the molding block 480 is placed in the internal cavity area 430 with little or no adhesive material.

Figure 4K:
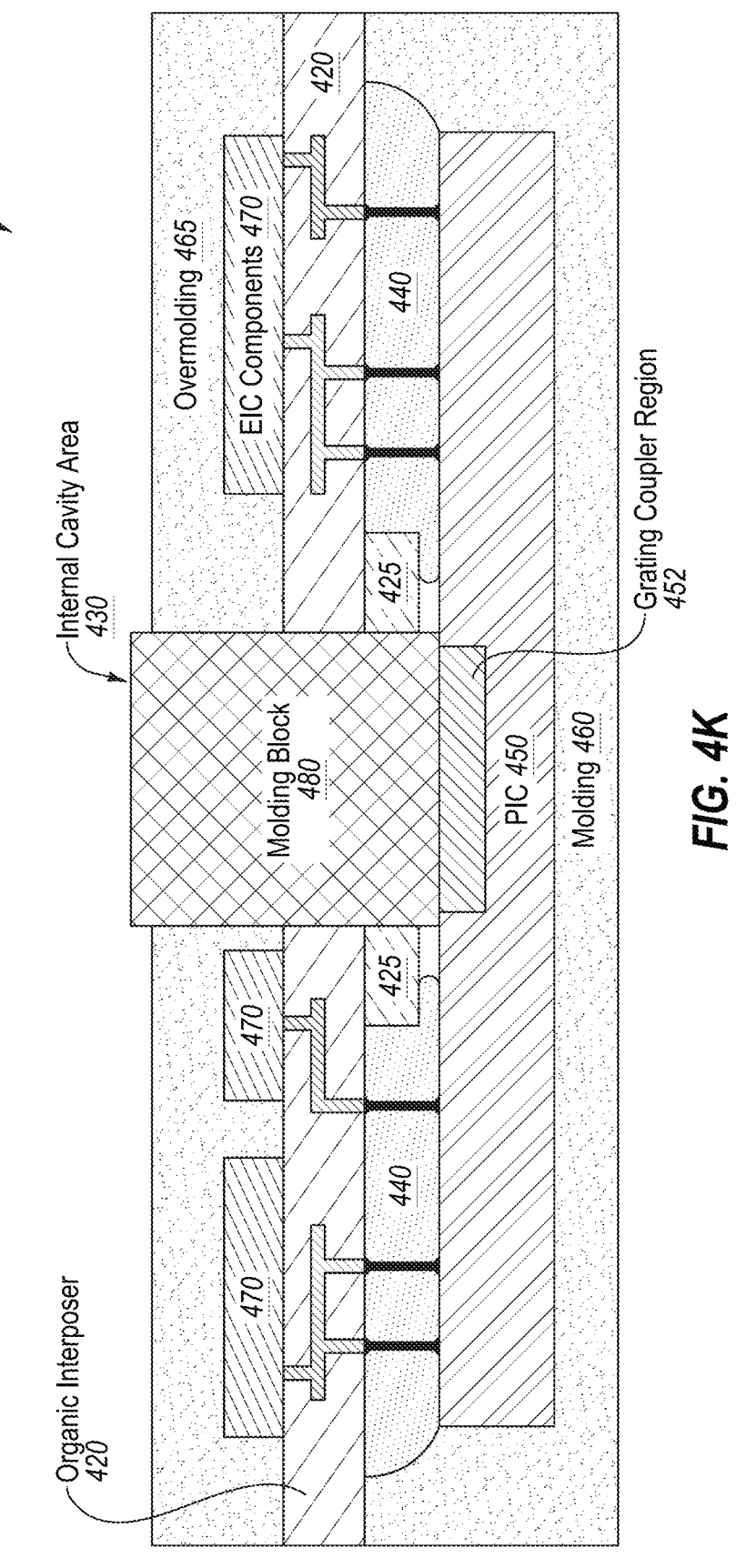

FIG. 4K includes applying an overmolding 465 to the top of the circuit package 400. The overmolding 465 may provide structural support for the exposed components of the circuit package 400.

In some implementations, the molding material is the same as described in connection with FIG. 4F. Alternatively, the molding material may differ from the molding material described above. The molding material may also be solidified as described above.

In one or more implementations, the molding material does not cover the top surface of the molding block 480. In some implementations, the molding material covers the top surface of the molding block 480. In these implementations, the overmolding 465 may be ground down to expose the molding block 480.

Figure 4L:
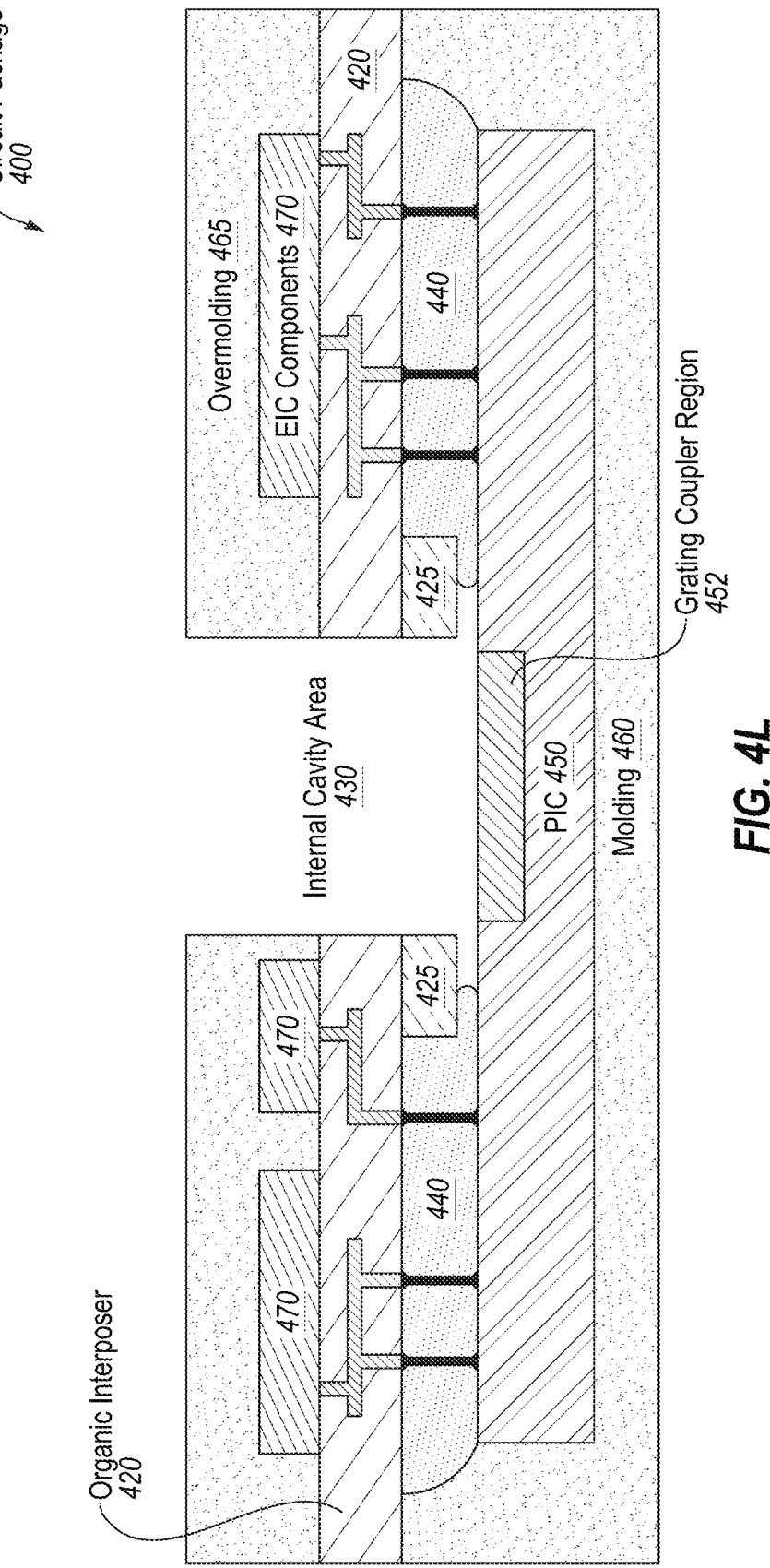

FIG. 4L shows removing the molding block 480 to reopen a photonic path to the GC region 452 of the PIC 450 via the internal cavity area 430. If the molding block 480 is attached, it may be detached. In addition, the molding block 480 may be removed and discarded.

Figure 4M:
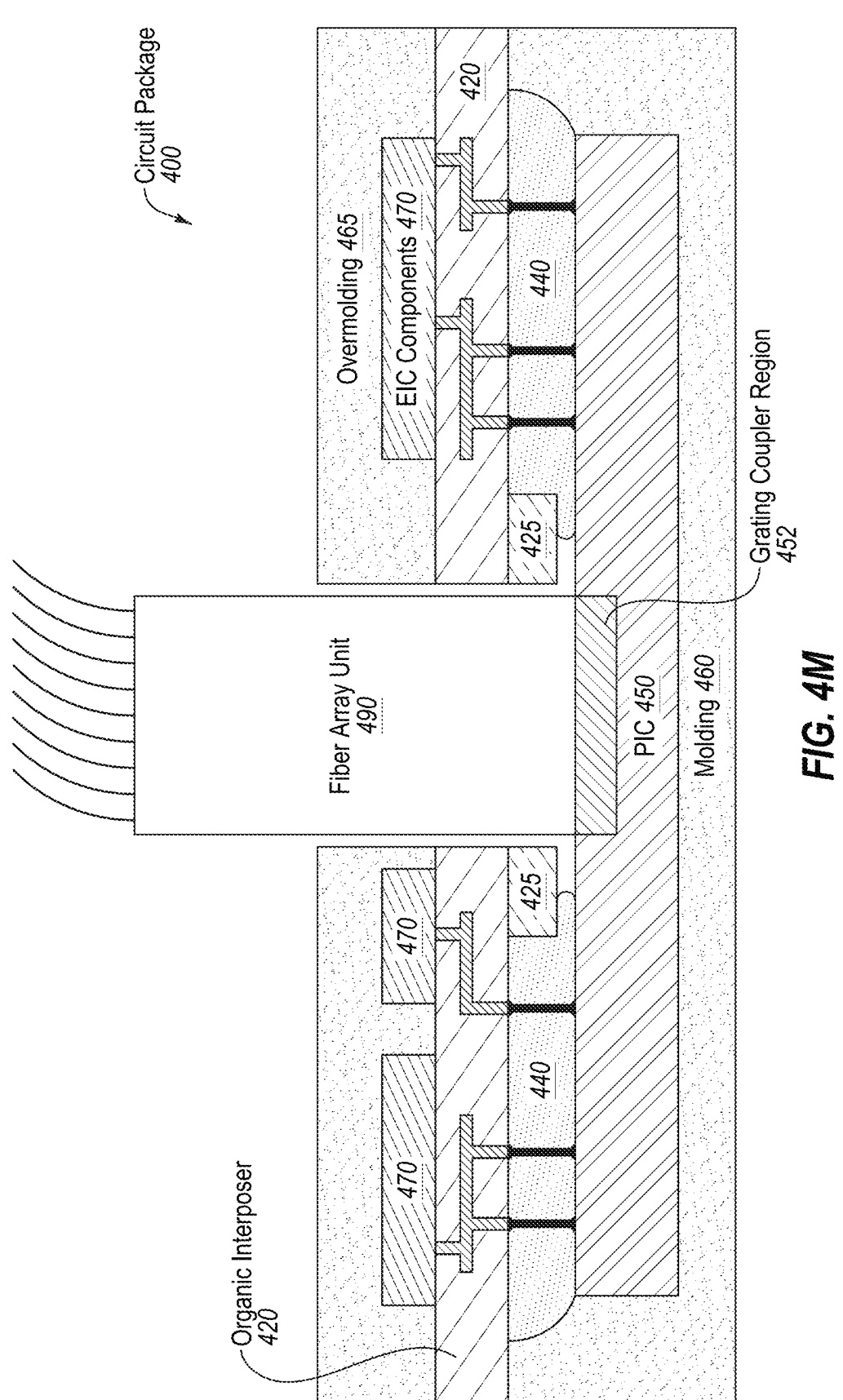
Figure 4N:
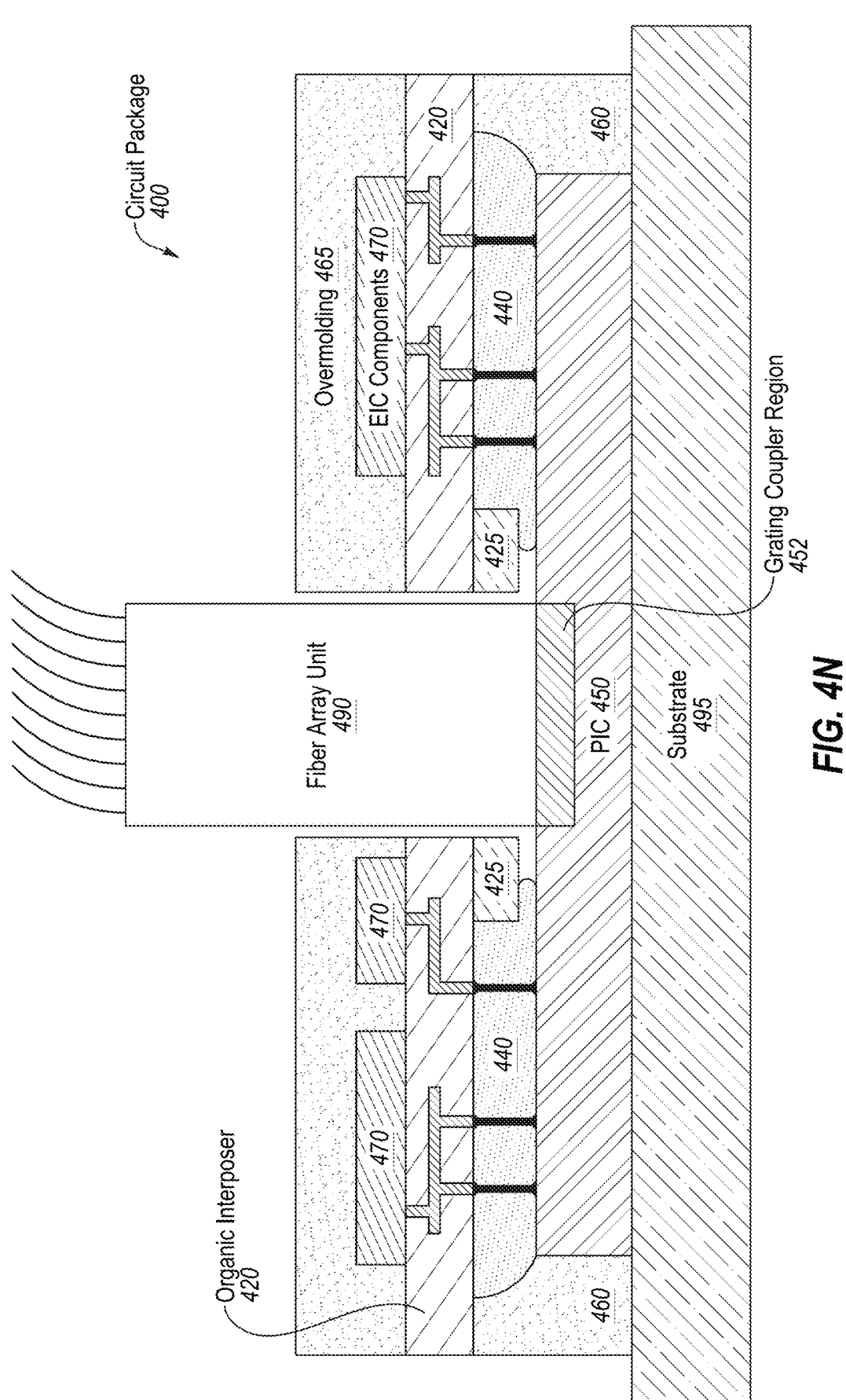

FIG. 4M includes adding an FAU 490 to the circuit package 400. For example, the FAU 490 (or another optical interface) is inserted into the internal cavity area 430 and connected to one or more GCs in the GC region 452 of the PIC 450. An alignment and attachment process may be used to accurately and securely couple the FAU 490 with gating couplers within the GC region 452 of the PIC 450.

As shown, the FAU 490 rises above the top of the circuit package 400. Indeed, in various implementations, the FAU 490 is significantly taller than the internal cavity area 430. In addition, the FAU 490 allows light to enter and exit the PIC 450 via the GC region 452. For example, while not shown, the FAU 490 includes optical fibers that connect the PIC 450 to an adjacent circuit package or an external device.

FIG. 4N includes attaching the circuit package 400 to a substrate 495. For example, the circuit package 400 is attached to a substrate next to other similar circuit packages. The substrate 495 may be a wafer or another material. The circuit package 400 may be temporarily or permanently attached to the substrate 495.

As mentioned above, FIGS. 5A-5B describe a process-based approach for building a circuit package. In particular, FIGS. 5A-5B illustrate an example flow diagram of building a circuit package that includes an organic interposer with an internal cavity area supported by a dam wall, a photonic integrated circuit (PIC) connected to the organic interposer via electrical components, and an underfill material between the organic interposer and the PIC according to some implementations. As shown, FIGS. 5A-5B includes a series of acts 500 for creating the circuit package.

As shown in FIG. 5A, the series of acts 500 includes act 502 of obtaining a removable mechanical base. For example, the process of creating a circuit package begins with placing, forming, or creating a removable mechanical base, which will be removed from the circuit package at a later stage. In some implementations, the removable mechanical base is large enough to create multiple circuit packages next to each other. In some instances, multiple removable mechanical bases are obtained concurrently to assemble multiple circuit packages at the same time. As described above, the removable mechanical base can include various materials.

Act 504 includes forming an organic interposer with an internal cavity area over the removable mechanical base. In various implementations, the organic interposer is formed on the removable mechanical base (or via an intermediary bonding layer) using one or more materials. In particular, when depositing or forming the organic interposer on the removable mechanical base, a space or hole is maintained for an internal cavity area to form within the organic interposer. Indeed, act 504 may include creating one or more internal cavity areas within the organic interposer by not depositing any material on the removable mechanical base in these areas and leaving the removable mechanical base exposed.

In some instances, the organic interposer is created by layering one or more materials in specific patterns, each of which includes a void for the internal cavity area. When stacked, the patterns create one or more electrical connections from the bottom surface to the top surface of the organic interposer. In some implementations, electrical connection elements are located at the top and/or bottom of the organic interposer for electrical connections to be attached.

In one or more implementations, act 504 includes using a lithography process to build layers of material with electrically conductive patterns over the removable mechanical base. For example, a first layer of material is deposited (e.g., placed with a first material, etched, cleaned, filled with a second material, and/or polished) on the removable mechanical base to form the organic interposer. The lithography process then proceeds to deposit layer by layer, building up the organic interposer. In particular, the lithography process includes creating one or more internal cavity areas by depositing material that surrounds the internal cavity areas of the organic interposer. Specifically, when depositing the materials for the organic interposer, the lithography process includes not depositing material within the internal cavity area of the organic interposer, leaving that portion of the removable mechanical base exposed.

In various implementations, Act 504 includes placing (or bonding) an assembled organic interposer onto the removable mechanical base. For example, a pre-assembled organic interposer is attached to the removable mechanical base. In some implementations, when the organic interposer is pre-assembled, the removable mechanical base may not be needed.

The processes of depositing material for the organic interposer on the removable mechanical base is described above. In some implementations, a bonding layer is first placed on the removable mechanical base. In these implementations, the organic interposer is attached to the removable mechanical base via the bonding layer. For example, when forming the organic interposer using a layering process, the first layer of material is deposited onto the bonding layer, which attaches it to the removable mechanical base.

Act 506 includes building a dam wall on top of the organic interposer to form a perimeter wall around the internal cavity area. In various implementations, Act 506 includes building up a mask layer to serve as a dam wall or a perimeter wall around the internal cavity area. The top surface of the dam wall can form an even level above the organic interposer.

In various implementations, the same process used to create the organic interposer can be used to add the dam wall to the organic interposer. Similarly, one or more of the same materials used to create the organic interposer can be used to generate the dam wall. In some instances, creating the dam wall is part of forming the organic interposer, such that the dam wall is integrated into the organic interposer but rises above the larger top surface of the organic interposer.

The dam wall can be placed around the entire internal cavity area to form an enclosed perimeter wall. Indeed, the dam wall can extend the interior wall of the organic interposer above the general top surface of the organic interposer. Furthermore, in various implementations, the interior dam wall facing the internal cavity area can be flush with the interior wall of the organic interposer also facing the internal cavity area. In some instances, the interior dam wall can be offset from the organic interposer's interior wall. In some implementations, the dam wall has a different shape than the internal cavity area. For example, the internal cavity area is ovular, while the dam wall is rectangular.

Act 508 includes depositing a PIC over the organic interposer, with a GC region of the PIC positioned over the internal cavity area of the organic interposer. In some instances, the PIC has a similar or smaller bottom surface size compared to the top surface of the organic interposer. In various implementations, act 508 includes obtaining a PIC with a GC region located on a bottom surface, positioned away from the side edges (e.g., an internal GC region).

To elaborate, by design, the location of the GC region on the PIC matches or is smaller than the perimeter created by the dam wall, such that the GC region aligns with the internal cavity area of the organic interposer. Accordingly, when placing the PIC over the organic interposer, the GC region covers the internal cavity area of the organic interposer, positioned within the perimeter created by the dam wall.

Act 508 also includes connecting the electrical components of the PIC with the organic interposer. In particular, in various instances, electrical connection elements on the bottom surface of the PIC are connected to electrical connection elements of the organic interposer via electrical connections. Additional details regarding electrical components in a PIC, electrical connection elements, and electrical connections are provided below in connection with FIGS. 8 and 9A-9B.

In various implementations, connecting the PIC to the organic interposer via the electrical connections causes the PIC to rest slightly above the dam wall. As mentioned above, in some instances, after connecting the PIC with the organic interposer via the electrical connections, the PIC is flush with the top of the dam wall. However, in other instances, after connecting the PIC with the organic interposer via the electrical connections, the PIC sits above the dam wall, creating a small gap between the PIC and the organic interposer. These latter instances often occur because the micro-scale of the circuit package makes the flush-mounted PIC infeasible.

Act 508 can also include solidifying the electrical connections between the PIC and the organic interposer. For example, the electrical connections are secured by using a heat-sinking process to solder the electrical connections between the PIC and the organic interposer. In some instances, the process of securing the electrical connections is performed after an underfill material is applied.

Act 510 includes inserting an underfill material in the gaps between the PIC and the organic interposer. For example, an underfill material is placed between the PIC and the organic interposer. Indeed, the underfill material is placed on top of the organic interposer, begins to flow across the top surface of the organic interposer, and covers the top surface of the organic interposer until it reaches the bottom surface of the PIC. However, the dam wall prevents the underfill material from entering the internal cavity area of the organic interposer.

To elaborate, in many instances, when there is a small gap between the top of the dam wall and the bottom of the PIC, and one or more larger gaps between the organic interposer and the PIC elsewhere, the underfill material has a viscosity (e.g., viscosity value) that is low enough to flow freely across the top of the organic interposer and fill the one or more larger gaps. However, the viscosity of the underfill material is also high enough that when entering the small gap between the top of the dam wall and the bottom of the PIC, the underfill material clogs, halts, or stops flowing before entering the internal cavity area. Stated differently, the underfill material may have a viscosity within a range of values that causes it to clog when flowing across the small gap and not clog when flowing across the larger gaps.

Act 510 includes inserting the underfill material until the one or more larger gaps between the PIC and the organic interposer are sufficiently filled. In some implementations, "sufficiently filled" means the space between the PIC and the organic interposer, excluding the area above the dam wall and the internal cavity area, is entirely filled. In some instances, "sufficiently filled: means the underfill material forms enough connection points between the PIC and the organic interposer to create a stable structure when the underfill material is hardened. In some implementations, the underfill material is only inserted within the small gap between the dam wall and the PIC. In some instances, act 510 is omitted, and no underfill material is inserted.

Act 512 includes solidifying the underfill material. In various implementations, the underfill material is hardened to form a supportive structure between the PIC and the organic interposer. The underfill material may be hardened using heat, light, time, chemical reactions, enzymes, a combination of these approaches, or other means. For example, a heat-treatment process is applied to the circuit package portion that converts the underfill material from a liquid state to a solid state. In some instances, the underfill material hardens based on a combination of a reaction between two materials mixing within a given time period. In some cases, exposing the underfill material to a specific light wavelength (e.g., ultraviolet light) or an element (e.g., oxygen) solidifies the underfill material.

Act 514 includes adding a molding material over the PIC, exposed portions of the underfill material, and exposed portions of the organic interposer. For example, a molding material is poured or deposited on the exposed top surfaces of the circuit package portion. The molding material may provide additional support to the circuit package portion.

Because the internal cavity area (or multiple internal cavity areas) is sealed off by the underfill material, the molding material does not enter the internal cavity area. Indeed, the molding material covers the organic interposer, the exposed portions of the underfill material, and the PIC, but is blocked from entering the internal cavity area.

In some implementations, the molding material covers the top surface of the PIC. In various implementations, the molding material covers some or all of the sides of the PIC without covering some or all of the top surface of the PIC. In some implementations, the molding material covers the top surface of the PIC but is later ground down to expose the existing or a new top surface of the PIC.

As mentioned above, in some instances, no underfill material is applied. In some instances, this may be because the PIC sits flush with the dam wall, and adding the molding material covers the exposed portions of the circuit package portion, including filling the larger gap between the PIC and the organic interposer, but not the internal cavity area due to the dam wall. In some instances, this may be because the molding material has a viscosity value that causes it to clog within the small gap between the top of the dam wall and the bottom of the PIC, in a manner similar to what was as described above. Indeed, in some cases, the acts of adding the underfill material and adding the molding material are essentially combined.

Act 514 can also include solidifying the molding material. For example, the molding material can be hardened in one of the ways described above in connection with solidifying the underfill material or by another process.

Act 516 includes turning over the circuit package portion of the electro-photonic circuit package (e.g., the circuit package portion with the PIC and the organic interposer). In various implementations, the circuit package portion is flipped so that the removable mechanical base is on top and the organic interposer is above the PIC. In this orientation, the previous top surfaces of the organic interposer and the PIC have become bottom surfaces. Similarly, the previous bottom surfaces of the organic interposer and the PIC have become top surfaces. In particular, the internal cavity area of the organic interposer has moved from near the bottom to near the top of the circuit package portion.

Act 518 includes removing the removable mechanical base from the organic interposer. If the organic interposer is bonded to the removable mechanical base via a bonding layer or bonding material, the organic interposer may be debonded. The removable mechanical base may be detached from the organic interposer using other detachment processes.

With the removable mechanical base removed, the internal cavity area becomes exposed at the top of the circuit package portion. In particular, the internal cavity area creates a clear path to the PIC. More specifically, the internal cavity area creates a clear path to the GC region of the PIC, allowing open access to the GC region of the PIC via an optical window.

In FIG. 5B, act 520 includes adding EIC components to the organic interposer while leaving the GC region of the PIC exposed. In various implementations, one or more EIC components are added to the newly exposed top surface of the organic interposer. Because the organic interposer includes electrical connections from the top surface to the bottom surface, adding the EIC components to the organic interposer enables the EICs to be electronically coupled to the PIC, forming an electro-photonic circuit package.

In some instances, the EIC components are attached to electrical connection elements on the organic interposer. If electrical connection elements are not present on the organic interposer, act 520 may include adding them before attaching the EIC components. In some implementations, adding the EIC components includes attaching the EIC components to the electrical connection elements of the organic interposer via electrical connections.

Act 522 includes adding a temporary element over the GC region. For example, a molding block is added to cover the GC and/or the internal cavity area of the circuit package. In some implementations, the molding block is temporarily attached to the circuit package with an adhesive. In various instances, the molding block is placed in the internal cavity area without an adhesive.

In one or more implementations, the temporary element is shaped such that the bottom surface does not contact GCs in the GC region (e.g., the bottom is concave). In various implementations, the bottom surface of the temporary element matches the pattern or shape of an FAU that connects to the GC region. In some implementations, the bottom surface of the temporary element is flat. In various implementations, the bottom surface of the temporary element does not contact the GC region.

Act 524 includes adding a second molding material over the EIC components and the temporary element. For example, the second molding material is an over-molding that is applied to the exposed top surfaces of the newly formed circuit package. In these implementations, because the internal cavity area is covered with the temporary element, the GC region is protected from the second molding material.

Act 526 includes removing the temporary element to expose the GC region of the PIC. In implementations where the second molding covers or locks in the temporary element, act 526 may include grinding down the second molding material to uncover the temporary element. Once uncovered, the temporary element can be removed. In implementations where the temporary element is not covered by the second molding material, the temporary element may be removed directly. Removing the temporary element again provides open access to the GC region of the PIC via an optical window (e.g., internal cavity area).

Act 528 connects an FAU to the GC region of the PIC via the internal cavity area of the organic interposer. In one or more implementations, the FAU undergoes an alignment and attachment process to couple with GCs within the exposed GC region of the PIC. By connecting an FAU, the circuit package ca photonically communicate with other circuit packages and/or external devices.

Act 530 includes attaching the circuit package to a substrate with other circuit packages. For example, upon building an electro-photonic circuit package, that circuit package can be deposited on a wafer or substrate as part of a large processing device. In some implementations, the substrate includes multiple circuit packages.

Figure 6B:
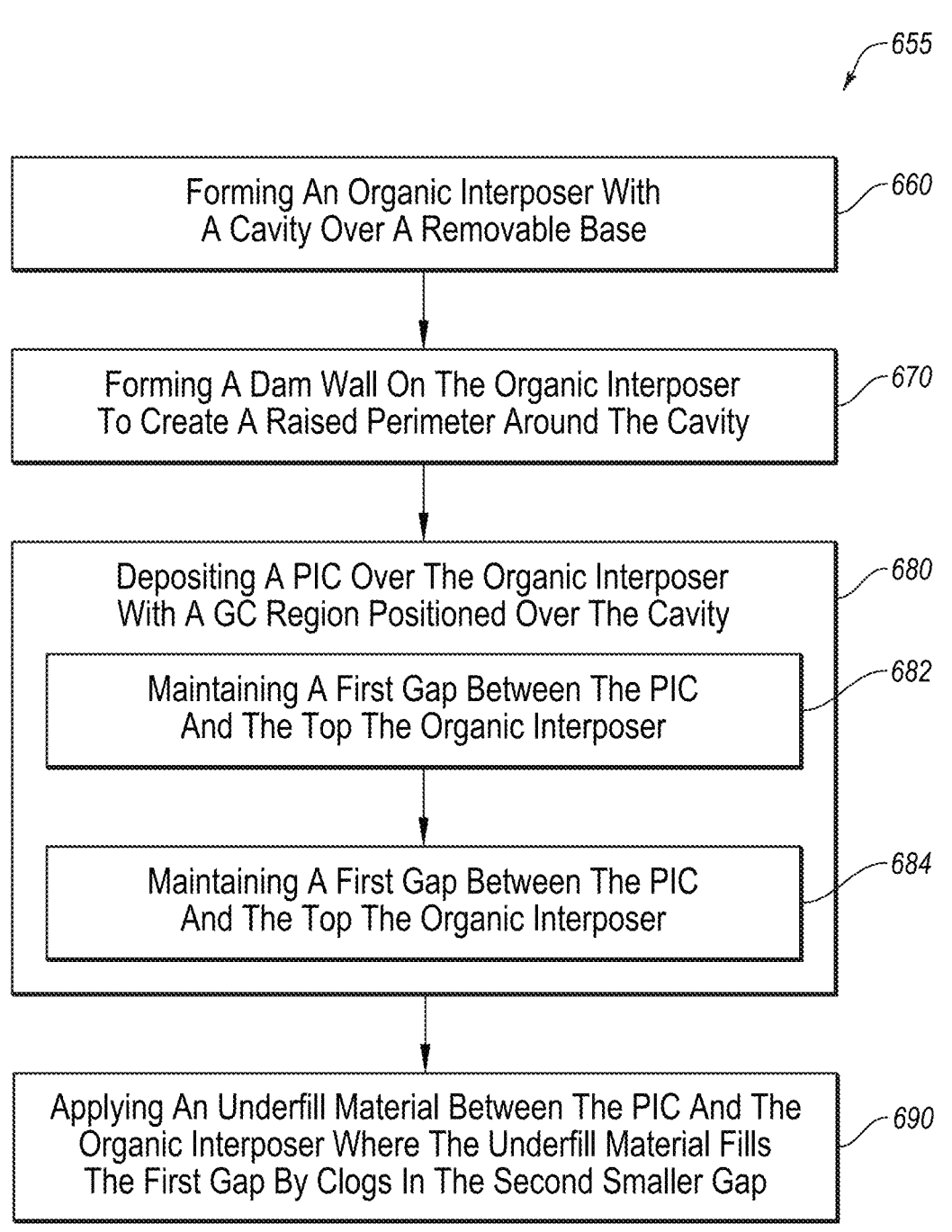

FIGS. 6A-6B illustrate example process flows for packaging a circuit package. In some implementations, FIGS. 6A-6B include an example process for packaging a photonic circuit while preserving optical access to a GC region on a PIC of the circuit package. In particular, FIG. 6A includes a first series of acts 600, and FIG. 6B includes a second series of acts 655.

While FIGS. 6A-6B illustrate acts according to one implementation, alternative implementations may add to, omit, modify, or reorder any of the acts shown. Furthermore, many of the implementations included in the first series of acts may be performed in connection with the second series of acts.

To illustrate, in FIG. 6A, the first series of acts 600 includes act 610 of forming an organic interposer with a cavity on a removable base. For instance, in various implementations, act 610 involves forming an organic interposer with an internal cavity area on a removable mechanical base. In some implementations, the removable mechanical base includes a glass carrier. In various implementations, the organic interposer includes one or more redistribution layers. In one or more implementations, forming the organic interposer includes utilizing a lithography process to build layers of material with electrically conductive patterns over the removable mechanical base.

Additionally, act 620 includes forming a dam wall on the organic interposer around the cavity area. For instance, act 620 involves forming a dam wall on the top surface of the organic interposer that surrounds the internal cavity area, with the dam wall creating a raised perimeter around the internal cavity area. In some implementations, forming the dam wall includes using the lithography process to avoid placing the layers of materials within the internal cavity area of the organic interposer, and the location of the internal cavity area corresponds to an expected position of the GC when the PIC is deposited over the organic interposer. In various implementations, the internal cavity area is defined by an internal interposer wall extending from the bottom surface of the organic interposer to the top surface of the dam wall, and the internal cavity area is void of material.

In one or more implementations, the dam wall has a height that is the same as or smaller in length than its width. In one or more implementations, the dam wall extends to the height of the organic interposer surrounding the internal cavity area, and the dam wall fully surrounds the internal cavity area. In some implementations, the dam wall forms the raised perimeter in a rectangular shape or a round shape around the internal cavity area. In some cases, the dam wall is created with the same material used to create or construct the organic interposer.

Additionally, act 630 includes depositing a PIC over the organic interposer with a GC region over the cavity. For instance, act 630 involves depositing a PIC over the organic interposer with a GC region of the PIC positioned over the internal cavity area of the organic interposer. In various implementations, depositing the PIC over the organic interposer includes coupling the electrical contacts of the PIC with electrical contacts on the top surface of the organic interposer such that a gap exists between the bottom surface of the PIC and the top surface of the dam wall. In some instances, a first gap between the bottom surface of the PIC and the top surface of the organic interposer is about 20 microns, and a second gap between the bottom surface of the PIC and the top surface of the dam wall is about 5 microns.

Additionally, act 640 includes applying an underfill material between the PIC and the organic interposer, where the dam wall prevents the underfill material from flowing into the cavity. For instance, act 640 involves applying an underfill material between a portion of the PIC and the organic interposer, wherein the dam wall positioned around the raised perimeter prevents the underfill material from flowing into the internal cavity area. In some implementations, the underfill material, when applied, clogs between the bottom surface of the PIC and the top surface of the dam wall to prevent the underfill material from entering the internal cavity area within the organic interposer. In various instances, the underfill material is epoxy.

In one or more implementations, a viscosity value of the underfill material causes the underfill material to stop at the dam wall positioned around the raised perimeter and prevents the underfill material from entering or flowing into the internal cavity area. In various implementations, the underfill material has a viscosity (e.g., thickness) that allows the underfill material to fill the first gap, clog in the second gap without entering the internal cavity area, and not contact the GC region on the PIC.

Additionally, act 650 includes solidifying the underfill material to seal off the cavity. For instance, act 650 involves solidifying the underfill material such that a seal between the PIC and the organic interposer is created around the internal cavity area of the organic interposer.

In one or more implementations, the series of acts 600 includes additional acts. For example, the series of acts 600 includes applying a molding compound over the PIC, exposed portions of the underfill material, and exposed portions of the organic interposer, wherein the underfill material clogged by the dam wall prevents the molding compound from entering the internal cavity area. In one or more implementations, the series of acts 600 includes debonding the removable mechanical base to remove the removable mechanical base from the organic interposer and attaching an electronic integrated circuit component (EIC component) to the organic interposer. In some instances, the EIC component electronically communicates with the PIC via the organic interposer, and the EIC component is offset from the internal cavity area of the organic interposer.

In one or more implementations, the first series of acts 600 includes inserting an FAU into the internal cavity area of the organic interposer and attaching the FAU to the GC of the PIC. In various implementations, attaching the FAU to the GC of the PIC includes aligning the fiber ends of the FAU to bidirectional photonic links within the PIC that allow light to enter or exit via GCs within the GC region of the PIC. In some implementations, the FAU connects the EIC component to an external device via the organic interposer, the PIC, and an optical connection between the FAU and the external device.

Turning to FIG. 6B, the second series of acts 655 includes act 660 of forming an organic interposer with a cavity over a removable base. For instance, in various implementations, act 660 involves forming an organic interposer over a removable mechanical base using lithography, with the organic interposer including an internal cavity area.

Additionally, act 670 includes forming a dam wall on the organic interposer to create a raised perimeter around the cavity. For instance, act 670 involves forming a dam wall on the top surface of the organic interposer that creates a raised perimeter on the organic interposer around the internal cavity area.

Additionally, act 680 includes depositing a PIC over the organic interposer with a GC region positioned over the cavity. For instance, act 680 involves depositing a PIC over the organic interposer with the GC region of the PIC positioned over the internal cavity area of the organic interposer.

As shown, act 680 includes two sub-acts, including a first sub-act 682 of maintaining a first gap between the PIC and the top of the organic interposer. For instance, the first sub-act 682 involves maintaining a first gap between the bottom surface of the PIC and the top surface of the organic interposer upon attaching the PIC to the organic interposer. The second sub-act 684 includes maintaining a second smaller gap between the PIC and the top of the dam wall. For instance, the second sub-act 684 involves maintaining a second gap between the bottom surface of the PIC and the top surface of the dam wall that is smaller than the first gap upon attaching the PIC to the organic interposer.

Additionally, act 690 includes applying an underfill material between the PIC and the organic interposer, where the underfill material fills the first gap by clogging in the second smaller gap. For instance, act 690 involves applying an underfill material between the first gap, wherein the dam wall positioned around the raised perimeter prevents the underfill material from flowing through the second gap into the internal cavity area.

Additional details are now provided regarding circuit packages, including electro-photonic circuit packages. In particular, FIGS. 7A-7B, FIG. 8, and FIG. 9A-9B provide additional details regarding wafers, circuit packages, bidirectional photonic paths, and optical connections via an FAU.

Additional details are now provided regarding circuit packages, including electro-photonic circuit packages. In particular, FIGS. 7A-7B, FIG. 8, and FIG. 9A-9B provide additional details regarding wafers, circuit packages, bidirectional photonic paths, and optical connections via an FAU.

As used herein, the term "photonic" refers to the use of light and/or photons for various applications. For instance, a "photonic path," "photonic channel," "photonic element," "photonic signal," and other similar uses operate based on the transmission of electromagnetic radiation as photons. For instance, in some cases photonic refers to the transmission, manipulation, and/or use of light, such as light in the visible spectrum, or from about 400 to about 700 nm. In some cases, photonic refers specifically to laser light. For example, in some cases, photonic may include light or electromagnetic radiation in one or more of the ultraviolet spectrum (100 to 400 nm), the visible light spectrum (400 to 700 nm), or the infrared spectrum (700 nm to 1 mm). For example, in some cases herein, photons may be transmitted via a laser light source operating in any of these (or a smaller range) of wavelengths. In some cases, the term "optical" is used interchangeably herein to mean photonic.

Accordingly, a photonic path or photonic channel refers to the trajectory that photons (e.g., particles of light) follow through a medium or a device designed to guide or manipulate light. A photonic path can include waveguides, fibers, free space transmission paths, and other elements that provide precise control over photon behavior. In some instances, a photonic path includes photonic elements which route light through a medium. In various implementations, a photonic path corresponds to both macroscopic (classical optics) and microscopic (quantum optics) manipulations of photons.

Figure 7A:
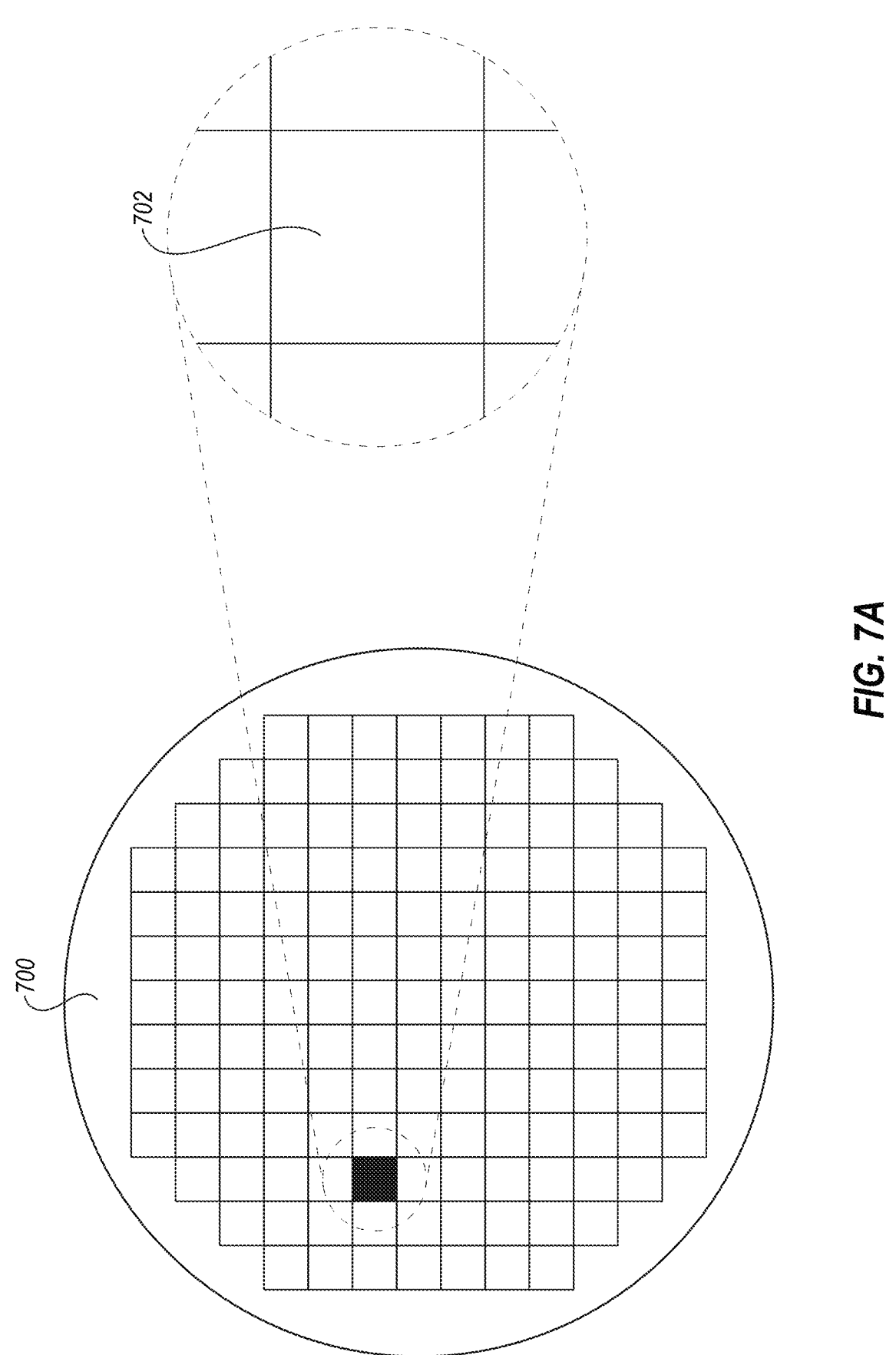
FIGS. 7A-7B illustrate example wafers that may be used to create dies for circuit packages and/or build circuit packages.

In various implementations, various components of a circuit package may be created using wafers. For example, FIG. 7A corresponds to using wafers to create circuit package components according to some implementations. To illustrate, FIG. 7A shows a top view of a wafer 700 and a die 702, which may be included in one or more circuit packages (e.g., microelectronic packages).

In some instances, the wafer 700 is composed of semiconductor material and includes one or more dies having integrated circuit (IC) structures formed on the surface of the wafer 700. As shown, the wafer 700 may comprise multiple (and often many) dies, which may be copies or iterations of the same IC, or may be ICs of different variations. Each of the dies may be a unit of a semiconductor product or other hardware that includes a suitable IC. After the fabrication of the semiconductor product is complete, the wafer 700 may undergo a singulation process in which the dies are separated from one another to provide discrete "chips" of the semiconductor product. The die 702, and at least one other die, may be included in a microelectronic package with a PIC. Accordingly, a die as used herein may refer to a section or portion of a larger wafer structure having an IC formed thereon or may refer to that section or portion having been diced or cut from the wafer as a discrete chip.

A PIC can be formed in a second process using a second wafer (not shown) in a manner analogous to the fabrication of the die 702. While the die 702 may be used to fabricate electronic elements, such as EIC components, a PIC may be fabricated with optical components. In some implementations, the PIC can be embedded into a package substrate. The package substrate may be considered a cored or coreless substrate and may include one or more layers of dielectric material, which may be organic or inorganic.

The package substrate may further include one or more conductive elements, such as vias, pads, traces, microstrips, strip lines, etc. The conductive elements may be internal to, or on the surface of, the package substrate. Generally, the conductive elements may allow for the routing of signals through the package substrate or between elements coupled to the package substrate. In some implementations, the package substrate may be a printed circuit board (PCB), an interposer (e.g., an organic interposer), a motherboard, or other types of substrate.

In one or more implementations, the wafer 700 or the die 702 may include a memory device, a computing device, a storage device, or a combination thereof (examples include, but are not limited to, a random-access memory (RAM) device (such as a static RAM (SRAM) device, a magnetic RAM (MRAM) device, a resistive RAM (RRAM) device, or a conductive-bridging RAM (CBRAM) device), a logic device (e.g., an AND, OR, NAND, NOR, or EXOR gate), a NANO flash memory, a solid-state drive (SSD) memory, a NOR flash memory, a CMOS memory, a thin-film transistor-based memory, a phase-change memory (PCM), a storage class memory (SCM), a magneto-resistive memory (MRAM), a resistive RAM, a DRAM, a high bandwidth memory (HBM), a DOR-based DRAM, a DIMM memory, a CPU, a GPU, an MPU, a tensor engine, a load/store unit (LDSU), a neural compute engine, a dot-product and/or convolution engine, a field-programmable gate array (FPGA), an artificial intelligence (AI) accelerator, or any other suitable circuit element.

Multiple instances of these devices may be combined on a single die. For example, the die 702 may include a memory comprising multiple memory arrays, one or more processors, other logic, communication circuits, and power management functions. The die may operate to execute instructions stored in the memory array or otherwise interact with the memory array using the processors on die 702.

Figure 7B:
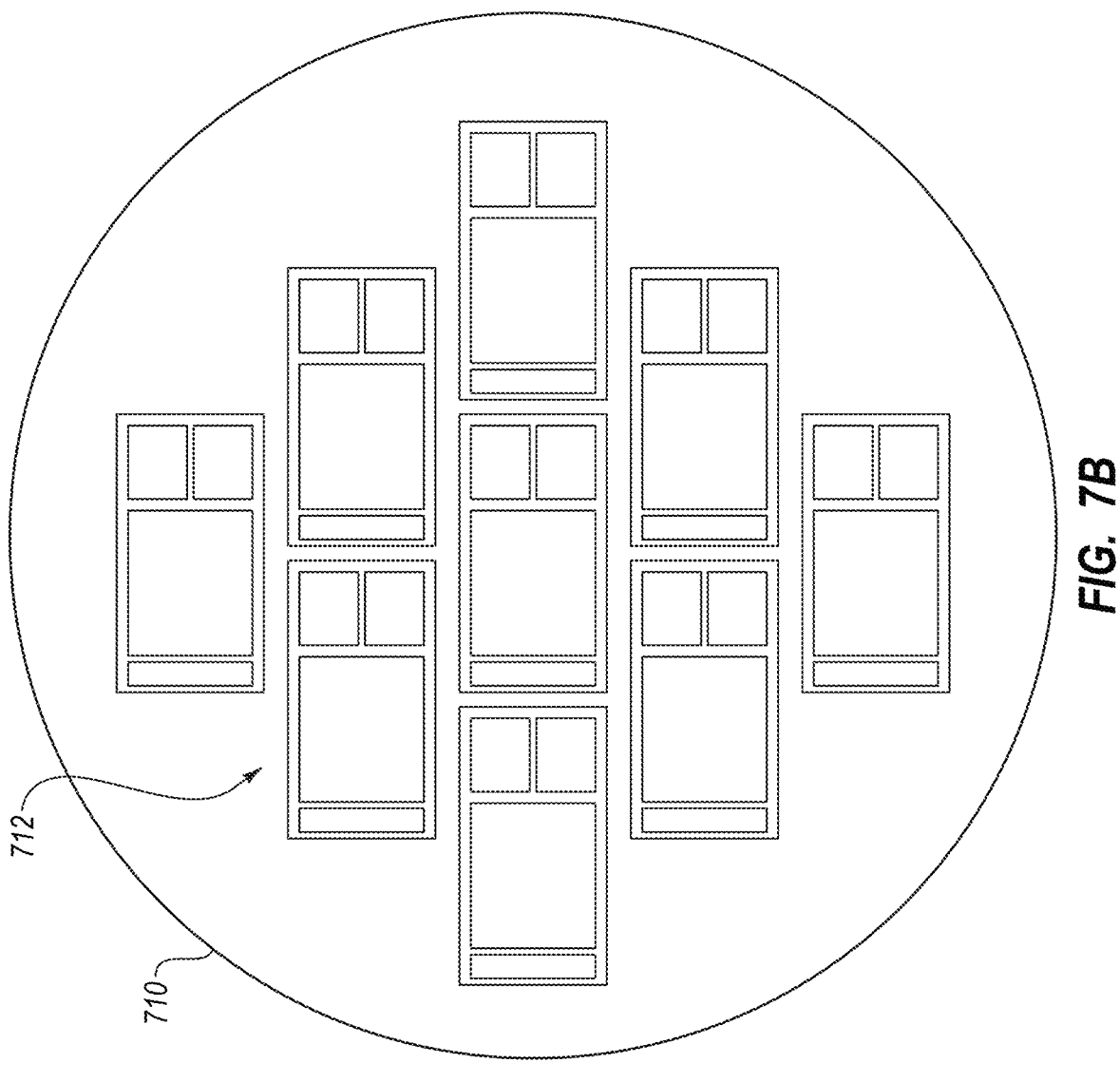

As an additional example of using wafers, FIG. 7B corresponds to components formed on wafers, including one or more circuit packages according to some implementations. To illustrate, FIG. 7B shows a top view of a wafer 710 having various components disposed thereon. For example, one or more circuit packages 712 (e.g., electro-photonic circuit packages) may be formed from various electronic components disposed on a corresponding portion of the wafer 710.

In some cases, the wafer 710 may be composed of a substrate material such as silicon or another substrate material. The substrate may include one or more layers of a dielectric material, which may be organic or inorganic. The wafer 710 may be a PIC wafer having photonic components and/or an EIC wafer having electronic components. In various implementations, the wafer 710 provides various photonic interfaces, channels, photonic components, and other photonic features which, in connection with corresponding electronic components, may form one or more circuit packages 712.

Similar to the above description, the wafer 710 may further include one or more conductive elements, such as vertical interconnect accesses (vias), pads, traces, microstrips, strip lines, etc. The conductive elements may be internal to, or on the surface of, the wafer 710. Generally, the conductive elements may allow for the routing of signals (e.g., power and/or communication signals) through the wafer 710 or between elements coupled to the wafer 710. In some implementations, the wafer 710 may be a PCB, PIC substrate, an interposer (e.g., organic interposer), a motherboard, or another type of substrate.

As mentioned, the one or more circuit packages 712, including electro-photonic circuit packages, may be formed from various electronic components disposed on the wafer 710. In some cases, the electronic components are coupled to photonic components in the wafer 710. In various implementations, the one or more circuit packages 712 include a memory device, a computing device, a storage device, or a combination thereof.

Multiple instances of these examples may be combined in a circuit package. For example, a circuit package may include a memory comprising multiple memory arrays, one or more processors, other logic, communication circuits, and power management functions.

Furthermore, the circuit package may execute instructions stored in the memory array or otherwise interact with the memory array using the processors on the one or more circuit packages 712.

In some cases, a single wafer may be advantageously manufactured and utilized for producing several circuit packages. For example, after the fabrication and/or assembly of the circuit packages is complete, the wafer 710 may undergo a singulation (e.g., dicing) process in which individual circuit packages are separated from one another to provide discrete "chips," as mentioned above. An electro-photonic circuit package may include any of the features and/or functionalities according to any of the circuit packages described in this document.

In some cases, each of the one or more circuit packages 712 of the wafer 710 is the same. In various implementations, one or more of the one or more circuit packages 712 (e.g., electro-photonic circuit packages) are configured differently.

In one or more implementations, the wafer 710 may be implemented in connection with various processing equipment by positioning, supporting, and/or securing the wafer 710 with respect to the processing equipment. In some cases, the processing equipment may manipulate, process, or otherwise operate on the wafer 710 as part of forming the one or more circuit packages 712, such as to form one or more TSVs at least partially through the wafer 710, to dispose, position, and/or bond dies to the wafer 710, to form overmolding on the wafer 710, or other processes.

Figure 8:
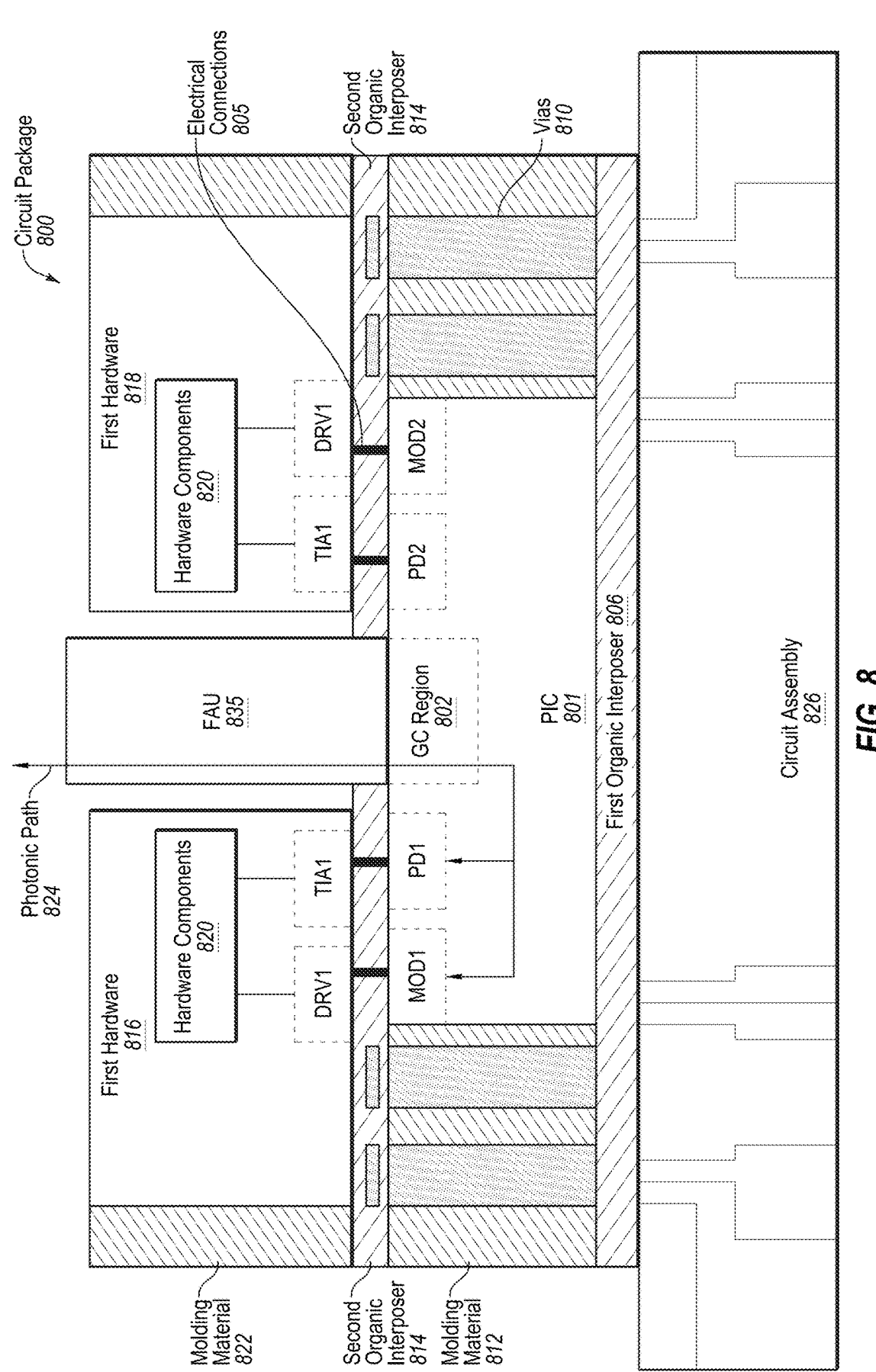
FIG. 8 illustrates an example circuit package having various PIC components and EIC components.

As mentioned above, circuit packages can include various components and connections. To illustrate, FIG. 8 shows an example side-view cross-section diagram of a circuit package that includes various components and that is coupled to a fiber array unit. In particular, FIG. 8 illustrates an example circuit package having various PIC components and EIC components according to some implementations. While FIG. 8 provides one example implementation of a circuit package that may be used in connection with a PIC and other circuit packages described in this document, FIG. 8 is not intended to limit all circuit packages.

As shown, FIG. 8 includes a circuit package 800 with a PIC 801, a first hardware 816 (e.g., a first die), and a second hardware 818 (e.g., a second die), each having one or more hardware components 820 and/or hardware elements. As shown, the PIC 801 includes a GC region 802 that allows photonic (e.g., optical or light) signals to enter and exit the PIC 801. In many implementations, the GC region 802 is coupled to an FAU 835, which sits between an internal cavity area within a second organic interposer 814.

As shown in FIG. 8, the PIC 801 is positioned over a first organic interposer 806. The first organic interposer 806 may be a redistribution layer (RDL) that provides any number of connection structures (e.g., interconnects or connection elements) through which components of the circuit package 800 and a circuit assembly 826 (e.g., a substrate) may communicate. For example, in some instances, the circuit assembly 826 is coupled to electrical or electro-photonic components that enable electrical communications to pass between the circuit package 800 and other components that are electrically coupled to the circuit assembly 826.

The first organic interposer 806 (and organic interposer layers such as the second organic interposer 814) may refer to a layer having a variety of thicknesses and which includes one or more input/output (I/O) pads (electrical connection elements) that provide connectivity for electrical elements of the circuit package to communicate electronically with other elements of the circuit package. The organic interposer layers (e.g., the first organic interposer 806 and the second organic interposer 814) may include wiring, interconnects, and other components that enable components of the circuit package 800 to be electrically coupled to components of one or more additional electronic packages.

In various implementations, the circuit package 800 provides optically accessible co-packaged optics to connect one or more external packages to the PIC 801. Indeed, the GC region 802 couples to the FAU 835 (or another optical interface) such that some or all of a bidirectional photonic path within the circuit package 800 photonically communicates with a light engine or another external device. In turn, the bidirectional photonic path allows these external components to communicate with the hardware components (e.g., the first hardware 816 and the second hardware 818) of the circuit package 800 via a photonic path 824.

The circuit package 800 also includes vias 810 (e.g., conductive through vias such as through-silicon vias (TSVs), through-chip vias, or through-substrate vias). The vias 810 may be manufactured in any known way so electrical signals (such as power and control signals) can travel between the organic interposers. The vias 810 provide interconnectivity between different layers of an electrical system within the circuit package 800. In addition, it will be understood that while FIG. 8 illustrates four of the vias 810, the circuit package 800 may include any number of the vias 810 in various configurations. Further, while FIG. 8 illustrates a side view showing a single row of vias 810, additional vias may be manufactured toward additional axes (e.g., y-axis, z-axis) relative to the side view shown.

In some implementations, the vias 810 are formed by etching, removing, or otherwise forming a channel void, conduit, or passage, then depositing one or more conductive layers in the channel. In some cases, the vias may pass entirely from a top surface to the bottom surface of a substrate or material (e.g., an organic interposer). In some cases, the vias may connect to one or more conductive layers, such as to one or more organic interposers. In this way, the vias 810 may facilitate connecting one or more components positioned on opposite surfaces of an organic interposer, such as connecting EIC components in a hardware or die to corresponding components in a PIC opposite the organic interposer. Additionally, vias may facilitate providing power transmission to various hardware components of the electrical dies by transmitting the power from or through the bottom surface of the circuit package 800.

As further shown in FIG. 8, the circuit package 800 includes molding materials 812, 822 deposited as part of the process of manufacturing the circuit package 800. The molding materials 812, 822 may be made from a variety of materials having various properties. For example, in one or more implementations, the molding materials 812, 822 are epoxy molding compounds in a liquid form that secure elements of the circuit package 800 in place and cover certain elements contained within the structure of the circuit package 800.

As shown in FIG. 8, the circuit package 800 includes a second organic interposer 814. As mentioned above, the second organic interposer 814 may be an RDL that provides any number of connection structures (e.g., interconnects) through which components of the circuit package 800 may communicate. For example, the second organic interposer 814 includes connective elements and/or interconnects between the vias 810 and the hardware components (e.g., the first hardware 816 and the second hardware 818) within the electronic portion (e.g., the electrical layer) of the circuit package 800. The second organic interposer 814 also includes electrical connections 805 (e.g., electrical interconnects or interconnections, such as copper pillars or wires) between the hardware components and the photonic components (e.g., MOD1, MOD2, PD1, and PD2) in the PIC 801.

As further shown in FIG. 8, the circuit package 800 includes connected hardware components (e.g., dies having EIC components) attached above the second organic interposer 814. In some implementations, the hardware components may include analog-mixed signal (AMS) blocks with components for facilitating the transmission of signals between an electronic domain and a photonic domain. For instance, the AMS blocks include photonic modulator drivers (DRV1, DRV2) for controlling associated photonic modulators (MOD1, MOD2). The modulators (MOD1, MOD2) receive photonic carrier signals and encode data into the carrier signals to transmit, via waveguides (e.g., a portion of the photonic path 824 located on the PIC 801), encoded or modulated photonic signals.

In various implementations, the AMS blocks also include transimpedance amplifiers (TIA1, TIA2) for receiving, through a connection to associated photodetectors (PD1, PD2), encoded photonic signals via one or more waveguides. In various implementations, the AMS blocks communicate with electrical hardware blocks (e.g., hardware components), which may refer to a variety of hardware blocks or dies, including EIC die(s) and/or application-specific integrated circuit (ASIC) die(s) having one or more of the components described in this document.

In one or more embodiments described herein, electrical components within the AMS blocks and connected optical components within the PIC 801 are included within respective portions of transceivers within the circuit package (e.g., to form a photonic fabric). For instance, in one or more embodiments described herein, an optical transmitter portion of a transceiver may include a modulator, and an electrical transmitter portion of the transceiver may include a driver. The driver may be coupled to the modulator via an interconnect. Further, an optical receiver portion of the transceiver may include a PD, and an electrical receiver portion may include a TIA. The TIA may be coupled to the PD via an interconnect.

As noted above, these respective receiver and/or transmitter portions of the transceiver may be connected via electrical connections (e.g., bumps) and electrical connection elements (e.g., electrical pads or other contacts). For example, an electrical connection element on a surface of the PIC 801 contacts electrical connection elements on a surface of electrical hardware via an electrical connection to form an electrical connection between the electrical hardware and the PIC 801. As illustrated and discussed in various embodiments, when connected, these optical and electrical portions may form electro-optical paths to and from electronic components to an optical window (e.g., the GC region 802), which enables optical signals to be received at and/or transmitted from the electrical components within a circuit package (e.g., the circuit package 800).

The electrical components of the electrical dies, such as the drivers (DRV1, DRV2) and the TIAs (TIA1, TIA2), may be connected to the corresponding photonic components in the PIC 801, such as MODs (MOD1, MOD2) and PDs (MOD1, MOD2), through electrical connections 805 (e.g., electrical interconnects). For example, the electrical connections 805 may be solder bumps, copper pillars, microbumps, or other interconnects for facilitating a connection of components at the surface of a wafer.

The electrical connections 805 may be printed, deposited, or otherwise positioned on a wafer in accordance with the topography, architecture, or layout of the photonic components in the PIC 801. For instance, the electrical connections 805 may be positioned on the surface of a wafer and may form a map or guide for orienting the positioning of the electrical dies (e.g., the first hardware 816 and the second hardware 818) on a wafer. In this way, disposing, positioning, bonding, or connecting components of EIC components with each electrical hardware to the wafer may include precisely aligning the EIC components with corresponding electrical connections to form electrical connections.

As mentioned above, in various implementations, the circuit package 800 is an electro-photonic circuit package that performs one or more computing, memory, or other functionalities and may communicate (e.g., transmit and/or receive) data via photonic signals. Indeed, the circuit package 800 may facilitate intra-chip electro-photonic communication as well as inter-chip electro-photonic communication.

The circuit package 800 includes a first hardware 816 and a second hardware 818, which may include one or more hardware components 820. The first hardware 816 and the second hardware 818 may have similar or different types of hardware components. For example, the first hardware 816 includes an ASIC chip that has been programmed, customized, or otherwise configured for a particular use. The first hardware 816 may additionally or alternatively include other types of hardware components (e.g., electrical hardware components).

The second hardware 818 may include a similar or different type of hardware components as the first hardware 816. For example, in one or more implementations, the second hardware 818 includes high bandwidth memory (HBM) hardware, a CPU, a GPU, a tensor engine, a neural compute engine, or an AI accelerator. Other implementations may include other types of hardware components. In one or more implementations, one or both of the hardware components are electronic hardware components.

While not shown in the illustrated example in FIG. 8, additional components and layers may be manufactured or otherwise added onto the surface of the circuit package 800. For example, one or more additional distribution layers may be added, and additional circuitry or hardware may be connected having a similar configuration as discussed in connection with any examples discussed herein.

As mentioned, the circuit package 800 couples with the FAU 835 or another type of optical interface (O/I), which attaches to the GC region 802 of the PIC 801 of the circuit package 800. The FAU 835 allows for optical fibers to be connected to the circuit package 800. Indeed, the interface block allows for an off-chip bidirectional photonic link to be created between the package hardware and external devices. In some implementations, the FAU 835 couples one or more optical fibers for transmitting photonic signals to and/or from the PIC 801 via the GC region 802.

In some implementations, the FAU 835 and the GC region 802 may facilitate receiving and transmitting (e.g., encoded) photonic signals between the circuit package 800 and other (e.g., off-chip) circuit packages. The GC region 802 of the PIC 801 may be an optical interface that utilizes a photonic path or photonic connection with the FAU 835. For example, the FAU 835 directly mounts or connects to the GC region 802 such that photonic signals are transmitted directly between GCs in the GC region 802 and corresponding optical elements in the FAU 835.

Figure 9A:
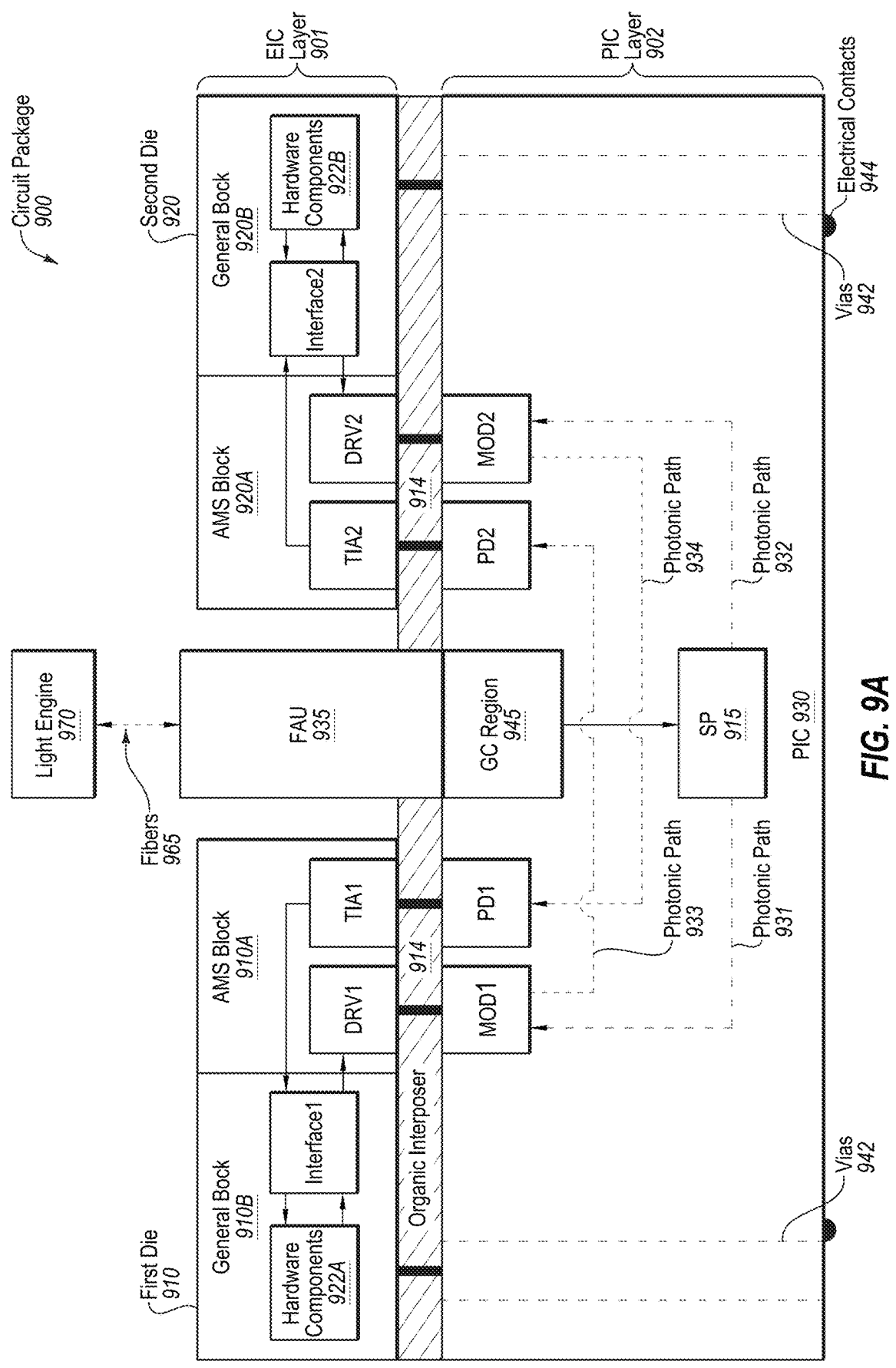
FIG. 9A illustrates an example circuit package with a bidirectional photonic path between optical components in a PIC and an external optical interface.
Figure 9B:
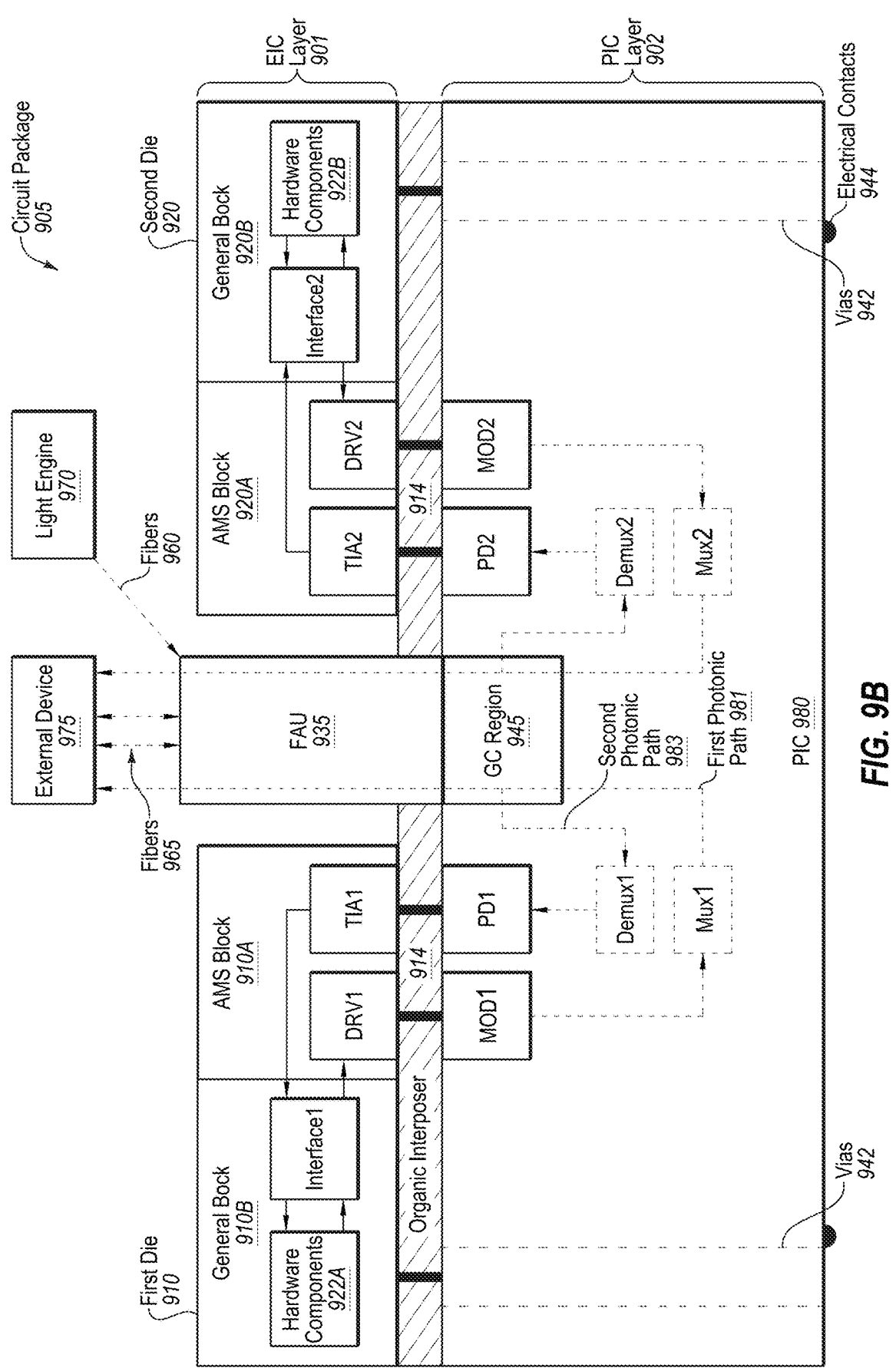
FIG. 9B illustrates an example of a circuit package with bidirectional photonic paths between optical components in a PIC and external components via an optical interface.

FIGS. 9A-9B illustrate example versions of circuit packages that create a photonic path between a circuit package and one or more circuit packages and/or external devices. Similar to the above description, the packages include a GC region (GC) within a PIC coupled to an FAU (e.g., an optical interface O/I). In some implementations, the PIC includes a GC region on the bottom surface, which enables the FAU or optical interface to couple to the GC region on the bottom of the PIC.

FIG. 9A shows an example of a circuit package 900 having an EIC layer 901 with a first die 910 and a second die 920 having intra-chip connections therebetween. The circuit package 900 also includes a PIC layer 902 that includes the PIC 930. To illustrate, FIG. 9A shows photonic paths starting at a light engine 970 that pass through the FAU 935 and the GC region 945 to provide light to a PIC 930. Additionally, the circuit package 900 includes a first die 910, divided into a general block 910B that may include various processing, storage, and communication functions and/or components, and an AMS block 910A that includes analog/mixed-signal circuits for interfacing with the PIC 930. The AMS block 910A of the first die 910 may include a driver (DRV1) and a transimpedance amplifier (TIA1). An AMS block 920A of the second die 920 may include a driver (DRV2) and a transimpedance amplifier (TIA2). A general block 920B of the second die 920 may include various processing, storage, and communication functions and/or components. In some instances, the package includes molding material surrounding the PIC 930 (e.g., an optical substrate).

As shown in FIG. 9A, the light engine 970 (e.g., laser light source) transmits light via fibers 960 to the FAU 935 and from the FAU 935 inside the PIC 930 via the GC region 945. In some instances, the GC region and the FAU is located on the bottom of the PIC, as described above. Once inside the PIC 930, the light travels to a splitter 915 (SP) that distributes the light over two different photonic paths 931 and 932 towards modulator MOD1 and modulator MOD2. Example modulator types include a Mach-Zehnder interferometer (MZI), ring resonator, electro-optic modulator (EOM), acousto-optic modulator (AOM), liquid crystal modulator (LCM), and digital micromirror device (DMD).

In one or more implementations, the splitter 915, or a splitter tree, distributes the light over more than two different photonic paths to additional modulators. A photonic path may be implemented with any suitable optical transmission medium and may include a mixture of waveguides, fibers, and/or free-space optical transmission paths.

Modulator MOD1 modulates the light it receives from the splitter 915 with information from driver DRV1 and transmits the modulated light to photodetector PD2 via photonic path 933. Photodetector PD2 converts the received modulated light into an electrical signal for the second die 920. Together with a serializer (not shown) in the first die 910, the driver DRV1, transimpedance amplifier TIA2, and a deserializer (not shown) in the second die 920, modulator MOD1, photonic path 933, and photodetector PD2 form a data channel, or a unidirectional electro-photonic link, from the first die 910 to the second die 920.

Similarly, modulator MOD2 modulates the light it receives from the splitter 915 with information from driver DRV2 and transmits the modulated light to photodetector PD1 via photonic path 934. Photodetector PD1 converts the received modulated light into an electrical signal for the first die 910. Together with a serializer (not shown) in the second die 920, the driver DRV2, transimpedance amplifier TIA1, and a deserializer (not shown) in the first die 910, modulator MOD2, photonic path 934, and photodetector PD1 form a data channel, or a unidirectional electro-photonic link, from the second die 920 to the first die 910.

As shown in FIG. 9A, the PIC 930 (e.g., a photonic IC) includes an organic interposer 914. The organic interposer 914 may include a bondpad pattern (e.g., an electrical connection element) located over MOD1 and PD1 that matches a bondpad pattern on the first die 910 located under DRV1 and TIA1, or is otherwise configured to form an electrical interconnection between the respective components. The organic interposer 914 may also include a bondpad pattern located over PD2 and MOD2 that matches a bondpad pattern on the second die 920 located under TIA2 and DRV2, or is otherwise configured to form an electrical interconnection between the respective components.

Two or more bondpads of the bondpad pattern on the first die 910 are physically and electrically coupled with two or more bondpads of the bondpad pattern in the organic interposer 914. Similarly, two or more bondpads of the bondpad pattern on the second die 920 are physically and electrically coupled with two or more bondpads of the bondpad pattern in the organic interposer 914.

In one or more implementations, the connective elements (e.g., interconnects) in the organic interposer 914 connect the dies (e.g., the first die 910 and/or the second die 920) to the top surface of the PIC 930. In addition, the interconnects may be implemented using a variety of structures, including copper pillars, solder connections, pads (e.g., bondpads), bump attachments, vias, or any variety of means by which the dies may be coupled to the PIC 930.

In FIG. 9A, an electrical interconnect is shown making a coupling (or abutted coupling) between elements in the AMS blocks of the dies and the corresponding elements in the PIC 930. In one or more implementations, the interconnect is a copper pillar no longer than 2 millimeters. In one or more implementations, the copper pillar can be less than 2 millimeters and, in some instances, less than 400 microns. In other implementations, the electrical interconnects can be solder bumps made of materials such as tin, silver, or copper. If solder bumps are used for the interconnects, then the solder bumps may be flip-chip bumps. In other implementations, the interconnects may be elements of a ball-grid array (BGA), pins of a pin grid array (PGA), elements of a land grid array (LGA), or another type of interconnect. In each of these examples, the interconnects can be less than 2 millimeters and, in some cases, range from 1 to 400 microns.

In general, the interconnects have drivers (DRVs) or transimpedance amplifiers (TIAs) at one end and optical modulators (MODs) or photodetectors (PDs) at the other end. For example, in one or more implementations, the interconnects (e.g., vias such as TSVs) may physically couple with, and allow electrical signals to pass between, electrical elements (e.g., pads) of the dies and and/or the PIC 930. For instance, vias 942 pass through the PIC 930 and electrically couple to electrical contacts 944 (e.g., electronic connective elements) at the bottom of the PIC 930 or the circuit package 900.

Additionally, in some instances, an electrical interconnect between a driver and a modulator allows the driver to provide an electrical signal that drives the modulator. In another instance, an interconnect between a transimpedance amplifier (TIA) and a photodetector allows the transimpedance amplifier to receive an electrical signal from the photodetector. In some implementations, the interconnects are such that a driver is stacked directly about a corresponding modulator with no lateral displacement between the two components and/or the two components are substantially in the same vertical column. Likewise, in some implementations, a TIA is stacked directly above a corresponding photodetector with no lateral displacement between the two components and/or the two components are substantially in the same vertical column.

The interconnects in the organic interposer may not have a uniform size, shape, or pitch. A finer pitch of interconnects may be desirable to allow a denser communication pathway between elements coupled to the PIC 930. In one or more implementations, one or more interconnects have minimal lateral displacement. For example, an interconnect is a copper pillar that is straight up and down, perpendicular to the face of a die and the PIC 930 (e.g., between 1-400 microns in length). This allows the electronic transceiver portions in the AMS block (e.g., DRV and TIA) to be directly stacked at one end of the interconnect above its respective photonic transceiver portion in the PIC (EAM and PD) at the other end of the interconnect. In some implementations, the DRV and TIA, as well as the EAM and PD, can be slightly offset from the copper pillar to reduce parasitic effects while still enabling a sub-400-micron gap (interconnect length) between heat-producing elements in the EIC/AMS and passive elements in the PIC 930.

FIG. 9B shows an example of a circuit package 905 that enables an inter-chip or inter-package connection. In particular, FIG. 9B shows a circuit package 905 (e.g., an electro-photonic circuit package) with a photonic path between the circuit package 905 and one or more external devices, which may include another circuit package. Similar to the description above, the circuit package 905 includes the GC region 945 of the PIC 980 connected to an FAU 935. The circuit package 905 includes an internal cavity area in the organic interposer 914 that enables the FAU 935 to couple directly to the GC region 945. Through the FAU 935 and the PIC 980, light signals can enter and exit the circuit package 905. For example, one or more bidirectional photonic paths through the PIC 980 allow dies connected to the PIC 980 to communicate with other external devices.

In FIG. 9B, paths for unmodulated light have been omitted in the PIC 980. Instead, FIG. 9B shows a first die 910 and second die 920 that can photonically communicate with an external device 975 (e.g., an external device optical interface) via fibers 965 (e.g., optical fibers), the FAU 935, and the PIC 980.

The first die 910 may transmit data to the external device 975 via Interface 1, DRV1, MOD1, and a first photonic path 981. As shown, the first photonic path 981 includes an optional multiplexer (MUX1) when wavelength division multiplexing is desired, a first grating coupler in the GC region 945, the FAU 935, and/or the fibers 965. Similarly, the first die 910 may receive data from the external device 975 via a second photonic path 983. The second photonic path 983 includes the fibers 965, the FAU 935, a second grating coupler in the GC region 945, and/or an optional demultiplexer when wavelength division demultiplexing is desired, PD1, TIA1, and Interface1 (I/F1). The first photonic path 981 and the second photonic path 983 (also referred to as unidirectional electro-photonic links) form a bidirectional data path between two devices on different chips.

While one or more of the above examples refer to specific types of dies, interconnects, substrates, grating couplers, and other specific elements associated with transmitting signals via respective components of the example packages, these are illustrative examples and may utilize different types of components. For example, the two (or more) dies may refer to a variety of hardware or dies and not necessarily the pairing of a general die and an AMS die as described in specific implementations herein. Indeed, the two dies may be similar types of hardware and may refer to computing hardware, processing hardware, storage hardware, memory hardware, or other hardware that is implemented on dies and may be coupled to a PIC that optically couples one or more of the dies to an external component in accordance with one or more implementations described herein.

As mentioned above, inter-chip or inter-package connections can include a photonic pathway in both directions (e.g., a bidirectional electro-photonic path), through which data may be communicated between a variety of external components (e.g., another circuit package) that are configured with the external device. In addition, it should be noted that features and functionality of the circuit package may be implemented within a variety of implementations and configurations of packages having different components, setups, and configurations.

One or more specific implementations of the present disclosure are described herein. These described implementations are examples of the presently disclosed techniques. Additionally, to provide a concise description of these implementations, not all features of an actual implementation may be described in the specification. Development of any such actual implementation, as in any engineering or design project, numerous implementation-specific decisions will be made to achieve the developers' specific goals, such as compliance with system-related and business-related constraints, which may vary from one implementation to another. Moreover, development effort might be complex and time-consuming but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one implementation" or "an implementation" of the present disclosure are not intended to be interpreted as excluding the existence of additional implementations that also incorporate the recited features. For example, any element described in relation to an implementation herein may be combinable with any element of any other implementation described herein. Numbers, percentages, ratios, or other values stated herein are intended to include that value, and also other values that are "about" or "approximately" the stated value, as would be appreciated by one of ordinary skill in the art encompassed by implementations of the present disclosure. A stated value should therefore be interpreted broadly enough to encompass values that are at least close enough to the stated value to perform a desired function or achieve a desired result. The stated values include at least the variation to be expected in a suitable manufacturing or production processes, and may include values that are within 5%, within 1%, within 0.1%, or within 0.01% of a stated value.

A person having ordinary skill in the art should realize, in view of the present disclosure, that equivalent constructions do not depart from the spirit and scope of the present disclosure, and that various changes, substitutions, and alterations may be made to the implementations disclosed herein without departing from the spirit and scope of the present disclosure. Equivalent constructions, including functional "means-plus-function" clauses, are intended to cover the structures described herein as performing the recited function, including both structural equivalents that operate in the same manner and equivalent structures that provide the same function. It is the express intention of the applicant not to invoke means-plus-function or other functional claiming for any claim except for those in which the words "means for" or "step for" appear together with an associated function. Each addition, deletion, and modification to the implementations that fall within the meaning and scope of the claims is to be embraced by the claims.

The terms "approximately," "about," and "substantially," as used herein, represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" and "below" are merely descriptive of the relative position or movement of the related elements.

The present disclosure may be embodied in other specific forms without departing from its spirit or characteristics. The described implementations are to be considered illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A circuit package, comprising:
   an organic interposer having a top surface and a bottom surface, wherein the organic interposer includes:
   an internal cavity area defining a hole in the organic interposer extending through the organic interposer from the top surface to the bottom surface; and
   a dam wall that rises above the top surface of the organic interposer and surrounds the internal cavity area;
   a photonic integrated circuit (PIC) positioned above the top surface of the organic interposer and attached to the organic interposer with electrical connections, wherein a photonically sensitive area of the PIC is located directly above the internal cavity area of the organic interposer; and an underfill material between the PIC and the organic interposer, wherein the underfill material is absent in the internal cavity area.

2. The circuit package of claim 1, further comprising:
   a removable mechanical base attached to the bottom surface of the organic interposer, wherein the hole in the internal cavity area exposes a portion of the removable mechanical base.

3. The circuit package of claim 1, further comprising an electronic integrated circuit component (EIC component) attached to the bottom surface of the organic interposer, wherein:
   the EIC component electronically communicates with the PIC via the organic interposer; and
   the EIC component is offset from the internal cavity area of the organic interposer.

4. The circuit package of claim 3, further comprising an electro-photonic transmitter and an electro-photonic receiver.

5. The circuit package of claim 4, wherein:
   a first portion of the electro-photonic transmitter or the electro-photonic receiver is located within the EIC component;
   a second portion of the electro-photonic transmitter or the electro-photonic receiver is located within the PIC; and
   the second portion in the PIC is connected electrically to the first portion via the organic interposer.

6. The circuit package of claim 5, further comprising a bidirectional photonic channel in the PIC, the bidirectional photonic channel including a first unidirectional photonic link in a first direction and a second unidirectional photonic link in an opposite direction.

7. The circuit package of claim 6, wherein the bidirectional photonic channel connects a central processing unit (CPU) connected to the EIC component with an external device.

8. The circuit package of claim 6, wherein:
   the first unidirectional photonic link includes a driver in the EIC component, a modulator in the PIC, and a waveguide from the modulator to a photonically sensitive region of the PIC, the photonically sensitive region of the PIC comprising grating couplers;
   the photonically sensitive region of the PIC with the grating couplers is located within the internal cavity area of the organic interposer; and
   the first unidirectional photonic link allows light to tangentially exit the PIC into the internal cavity area.

9. The circuit package of claim 8, further comprising a fiber array unit (FAU) attached to the PIC and positioned in the internal cavity area, such that light exiting the grating couplers is received by the FAU.

10. The circuit package of claim 6, wherein:
    the second unidirectional photonic link includes a transimpedance amplifier in the EIC component, a photodetector in the PIC, and a waveguide from the photodetector to a photonically sensitive region of the PIC with grating couplers;
    the photonically sensitive region of the PIC with the grating couplers is located within the internal cavity area of the organic interposer; and
    the second unidirectional photonic link allows light to be received into PIC via the grating couplers.

11. The circuit package of claim 10, further comprising a fiber array unit (FAU) attached to the PIC via the internal cavity area, such that light from an external device attached to the FAU travels to the FAU and enters the PIC via the second unidirectional photonic link.

12. A circuit package, comprising:

a removable mechanical base;

an organic interposer having a top surface and a bottom surface, the bottom surface attached over the removable mechanical base with a debonding material, wherein the organic interposer includes:

an internal cavity area defining a hole in the organic interposer extending through the organic interposer from the top surface to the bottom surface; and a dam wall that rises above the top surface of the organic interposer and surrounds the internal cavity area;

a photonic integrated circuit (PIC) positioned above the top surface of the organic interposer and attached to the organic interposer with electrical connections, wherein a photonically sensitive area of the PIC is located directly above the internal cavity area of the organic interposer;

an underfill material between the PIC and the organic interposer, wherein the underfill material is absent in the internal cavity area; and an electronic integrated circuit component (EIC component) attached to the PIC via the organic interposer, wherein the EIC component is offset from the internal cavity area of the organic interposer.

13. The circuit package of claim 12, wherein the removable mechanical base includes a glass carrier.

14. The circuit package of claim 12, wherein:

the internal cavity area is defined by an internal interposer wall from the bottom surface of the organic interposer to the top surface of the dam wall; and the internal cavity area is void of material.

15. The circuit package of claim 12, wherein:

the organic interposer is generated utilizing a lithography process that builds layers of material with electrically conductive patterns over the removable mechanical base;

the lithography process deposits material on the removable mechanical base surrounding the internal cavity area of the organic interposer; and the lithography process does not deposit material within the internal cavity area of the organic interposer on the removable mechanical base.

16. The circuit package of claim 12, wherein the internal cavity area is surrounded by material of the organic interposer and enables the removable mechanical base to be visible through the organic interposer.

17. The circuit package of claim 12, wherein the dam wall has a height length that is a same or smaller length than a width length.

18. The circuit package of claim 12, wherein:

the dam wall extends a height of the organic interposer surrounding the internal cavity area; and the dam wall fully surrounds the internal cavity area.

19. The circuit package of claim 12, wherein the dam wall forms a perimeter wall as a rectangular shape or a round shape around the internal cavity area.

20. The circuit package of claim 12, wherein the PIC attaches to the organic interposer via electrical connections that cause a gap to exist between a bottom surface of the PIC and a top surface of the dam wall.

21. The circuit package of claim 12, wherein the PIC attaches to the organic interposer such that a gap exists between a bottom surface of the PIC and a top surface of the dam wall.

22. The circuit package of claim 12, wherein:

a first gap between a bottom surface of the PIC and the top surface of the organic interposer is about 20 microns; and a second gap between the bottom surface of the PIC and a top surface of the dam wall is about 5 microns.

23. The circuit package of claim 22, wherein the underfill material has a viscosity value that causes the underfill material to fill the first gap and clog in the second gap without entering in the internal cavity area.

24. The circuit package of claim 12, wherein the underfill material includes a viscosity value that clogs the underfill material between a bottom surface of the PIC and a top surface of the dam wall.

25. A circuit package, comprising:

an organic interposer that includes:

an internal cavity area that defines a hole in the organic interposer extending through the organic interposer from a top surface of the organic interposer to a bottom surface of the organic interposer; and a dam wall that rises above a top surface of the organic interposer and surrounds the internal cavity area;

a photonic integrated circuit (PIC) positioned above the organic interposer and attached to the organic interposer with electrical connections such that:

a first gap exists between the PIC and a top surface of the organic interposer; and a second gap exists between the PIC and a top surface of the dam wall; and an underfill material between the PIC and the organic interposer, wherein the underfill material fills the first gap and a portion of the second gap without filling the internal cavity area.

26. The circuit package of claim 25, wherein the underfill material is epoxy.

27. The circuit package of claim 25, further comprising a first molding compound covering the PIC, exposed portions of the underfill material, and exposed portions of the organic interposer, wherein the underfill material clogged by the dam wall prevents the first molding compound from entering the internal cavity area.

28. The circuit package of claim 25, wherein:

the organic interposer is formed on a removable mechanical base; and the removable mechanical base includes a silicon carrier, metal carrier, polymer carrier, or tape carrier.

29. The circuit package of claim 25, wherein the organic interposer includes one or more redistribution layers.

30. The circuit package of claim 25, wherein the organic interposer includes polymer dielectrics and copper, aluminum, nickel, or gold.

\* \* \* \* \*